(12) United States Patent
Caragiulo et al.

(10) Patent No.: US 12,080,371 B2
(45) Date of Patent: Sep. 3, 2024

(54) SRAM POWER SWITCHING WITH REDUCED LEAKAGE, NOISE REJECTION, AND SUPPLY FAULT TOLERANCE

(71) Applicant: Meta Platforms Technologies, LLC, Menlo Park, CA (US)

(72) Inventors: Pietro Caragiulo, Palo Alto, CA (US); Daniel Henry Morris, Mountain View, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 188 days.

(21) Appl. No.: 17/891,858

(22) Filed: Aug. 19, 2022

(65) Prior Publication Data

US 2024/0062787 A1 Feb. 22, 2024

(51) Int. Cl.
*G11C 5/14* (2006.01)
*G11C 11/412* (2006.01)

(52) U.S. Cl.
CPC .......... *G11C 5/147* (2013.01); *G11C 11/4125* (2013.01)

(58) Field of Classification Search
CPC ..... G11C 5/147; G11C 11/4125; G11C 5/143; G11C 11/417; G11C 5/148; G11C 29/028
USPC ......................................................... 365/154
See application file for complete search history.

(56) References Cited

U.S. PATENT DOCUMENTS

| | | | |
|---|---|---|---|
| 6,208,170 B1 | 3/2001 | Iwaki et al. | |
| 7,177,176 B2 | 2/2007 | Zheng | |
| 7,863,971 B1 | 1/2011 | Nayak et al. | |
| 7,952,422 B2 | 5/2011 | Chuang et al. | |
| 11,670,364 B2 | 6/2023 | Morris et al. | |
| 2006/0262610 A1 | 11/2006 | Khellah et al. | |
| 2007/0063763 A1 | 3/2007 | Yoo et al. | |
| 2007/0081378 A1 | 4/2007 | Kawa | |
| 2008/0151673 A1 | 6/2008 | Fallah et al. | |
| 2010/0149884 A1 | 6/2010 | Kumar | |
| 2011/0261629 A1 | 10/2011 | Seshadri et al. | |

(Continued)

OTHER PUBLICATIONS

Clinton M., et al., "A Low-Power and High-Performance 10nm SRAM Architecture for Mobile Applications," 2017 IEEE International Solid-State Circuits Conference, Mar. 6, 2017, 3 pages.

(Continued)

*Primary Examiner* — Huan Hoang

(74) *Attorney, Agent, or Firm* — Weaver Austin Villeneuve & Sampson LLP

(57) ABSTRACT

Described are techniques for generating a supply voltage for an SRAM array using power switching logic. The power switching logic can generate the supply voltage using a first supply rail (supplying a higher voltage) during an active state and using a second supply rail (supplying a lower voltage) during a deep retention state. In some examples, a sensing and recovery (SR) unit is provided to sense a decrease in the second voltage, for instance, during the deep retention state. The SR unit can generate an additional voltage that modifies the supply voltage to be higher than the decreased second voltage, thereby reducing droop and/or noise in the second supply rail. The power switching logic, SR unit, and SRAM array can be co-located or distributed across a computer system. For instance, the power switching logic, SR unit, and SRAM array can be embedded within a System on Chip integrated circuit.

20 Claims, 14 Drawing Sheets

(56) References Cited

U.S. PATENT DOCUMENTS

| | | |
|---|---|---|
| 2012/0087196 A1 | 4/2012 | Yang et al. |
| 2014/0036612 A1 | 2/2014 | Rai |
| 2018/0089356 A1 | 3/2018 | Park et al. |
| 2019/0164596 A1* | 5/2019 | Lee ..................... G11C 11/417 |
| 2021/0089475 A1 | 3/2021 | Mathur et al. |
| 2022/0068368 A1* | 3/2022 | Geerlings ............. G11C 11/417 |
| 2023/0093270 A1* | 3/2023 | Li ......................... G11C 16/10 |
| | | 365/185.13 |
| 2023/0267992 A1* | 8/2023 | Gupta ................... G11C 11/419 |
| | | 365/154 |

OTHER PUBLICATIONS

International Preliminary Report on Patentability for International Application No. PCT/US2022/029351, mailed Nov. 30, 2023, 12 pages.
International Search Report and Written Opinion for International Application No. PCT/US2022/029351 mailed Aug. 12, 2022, 13 pages.
Non-Final Office Action mailed Sep. 30, 2022 for U.S. Appl. No. 17/303,084, filed May 19, 2021, 7 pages.
Notice of Allowance mailed Jan. 25, 2023 for U.S. Appl. No. 17/303,084, filed May 19, 2021, 5 pages.

* cited by examiner

| Mode | V1 | V2 | | A | BT | BB | | C | D | E |
|---|---|---|---|---|---|---|---|---|---|---|
| Normal (Active) | V1 | V2 | | 0 | 1 | 1 | | 1 | 1 | 1 |
| Retention | V1 | V2 | | 0 | 1 | 1 | | 1 | 0 | 0 |
| Deep Retention | V1 | V2 | | 1 | 0 | 0 | | 0 | 1 | 0 |
| Power-down | V1 | V2 | | 1 | 1 | 0 | | 0 | 0 | 0 |

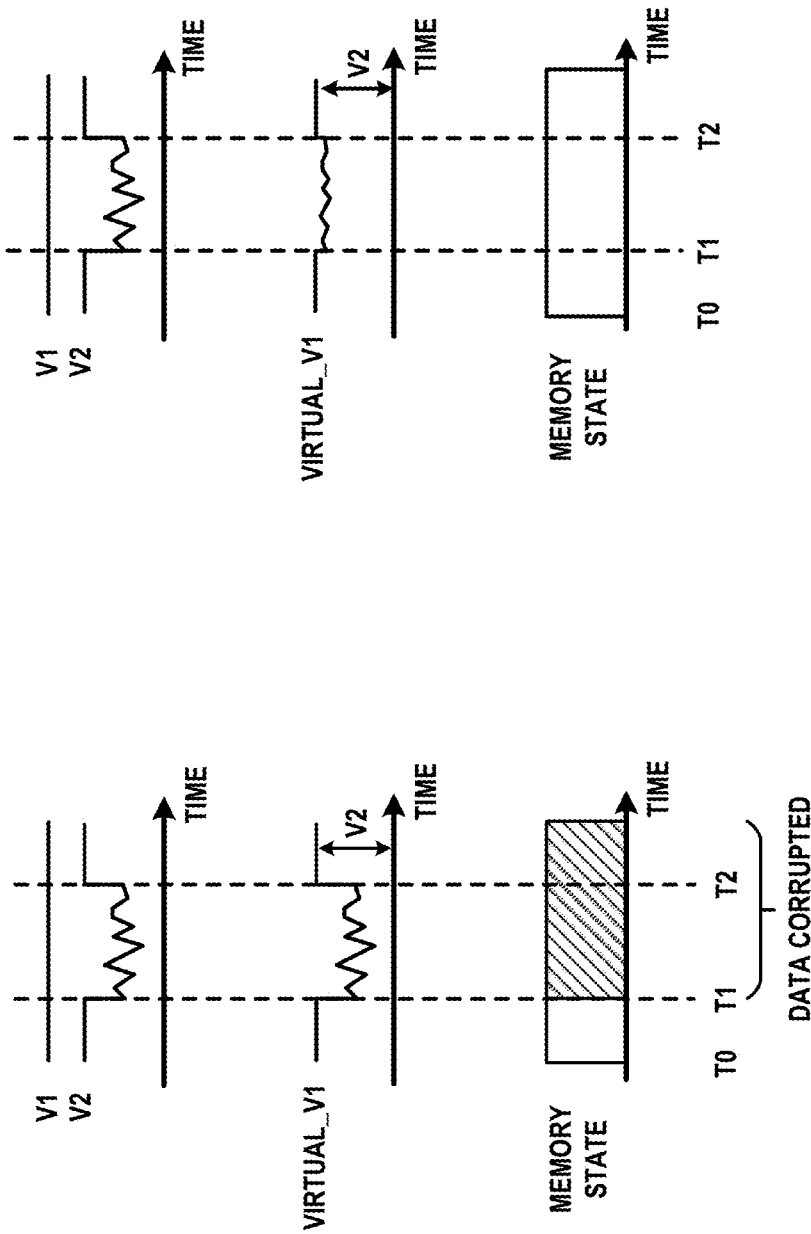

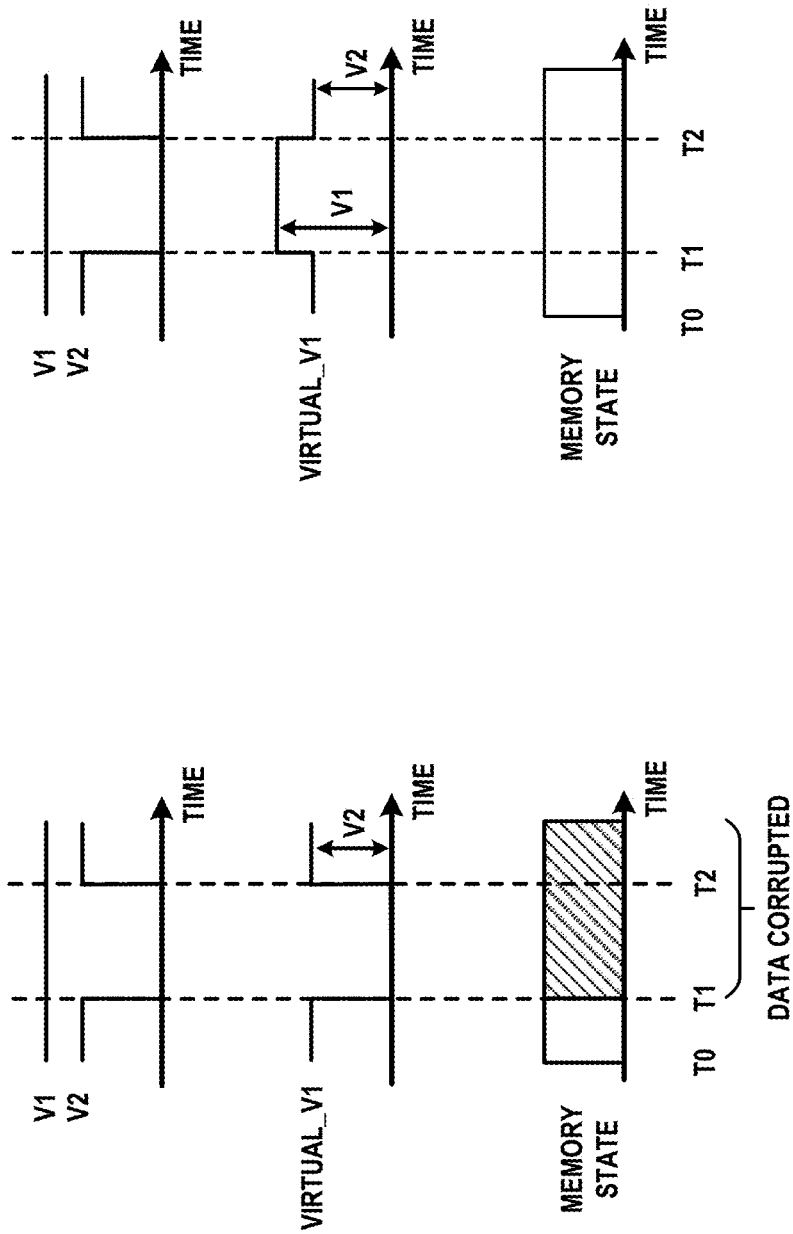

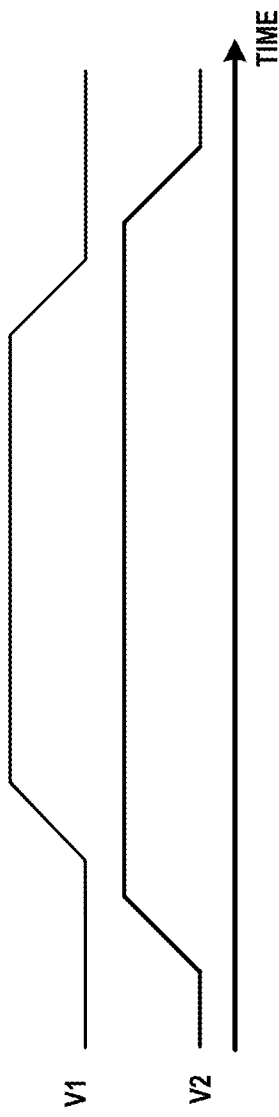
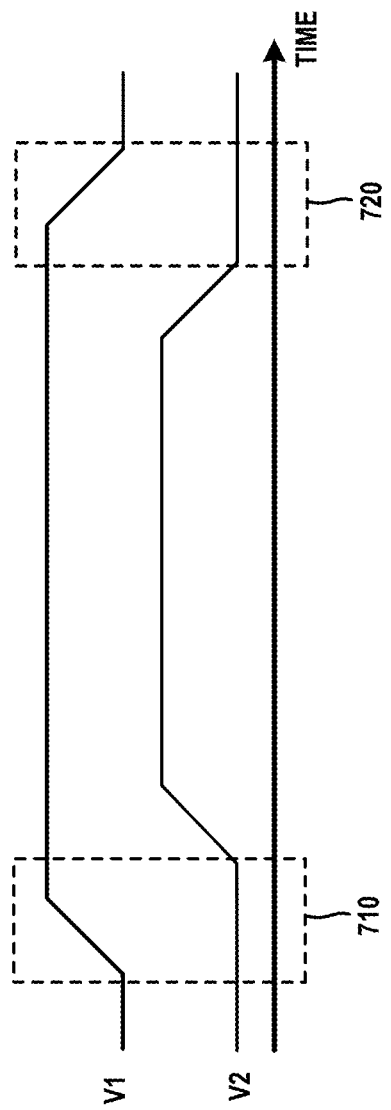

SRAM POWER SWITCHING WITH REDUCED LEAKAGE, NOISE REJECTION, AND SUPPLY FAULT TOLERANCE

TECHNICAL FIELD

The present disclosure generally relates to static random access memory (SRAM) devices that operate at multiple power levels. Aspects of the disclosure also relate to SRAM in artificial reality systems, such as augmented reality, mixed reality, and/or virtual reality systems.

BACKGROUND

Artificial reality systems are becoming increasingly ubiquitous, with applications in many fields. In general, artificial reality is a form of reality that has been adjusted in some manner before presentation to a user. Artificial reality may include, for example, virtual reality (VR), augmented reality (AR), mixed reality (MR), hybrid reality, or some combination and/or derivatives thereof. Typical artificial reality systems include one or more devices for rendering and displaying content to users. As one example, an artificial reality system may incorporate a head-mounted display (HMD) that is worn by a user and configured to output artificial reality content to the user. During operation, the user typically interacts with the artificial reality system to select content, launch software applications, configure the system and, in general, experience artificial reality environments. Artificial reality systems can be memory intensive, resulting in high power consumption in the absence of techniques to improve the power efficiency of memory. Additionally, providing the memory of an artificial reality system with a stable and reliable power supply becomes increasingly challenging as additional components, which have their own power demands, are integrated into the artificial reality system.

SUMMARY

Aspects of the disclosure are directed to techniques for switching an SRAM unit between power supply voltages (e.g., a higher operating voltage and a lower operating voltage) using switching elements that are configured to reduce power leakage, reject power supply noise, and compensate for power supply faults so that the SRAM unit can continue to operate without loss or corruption of stored data. In some examples, the switching elements are implemented on one or more System on Chip (SoC) integrated circuits that are part of, or communicatively coupled to, a head-mounted display in an artificial reality system.

Various low power devices, such as those used in AR/VR systems, may benefit from the power leakage reduction techniques and other power-related techniques of this disclosure. For example, a reduction of SRAM power leakage may result in lower overall power consumption by the SRAM unit and, as a result, a reduction in the amount of power required to operate the SRAM. Consequently, a device incorporating the SRAM unit (e.g., a head-mounted display) may be powered using a smaller battery or other power source (smaller in terms of the amount of power provided, the physical dimensions and/or the weight), leading to a corresponding reduction in the size and/or weight of the device. This may further lead to increased comfort for the wearer and a more fully immersive and realistic AR/VR experience.

As a further example, incorporating the noise rejection and supply voltage recovery techniques disclosed herein into an AR/VR system may provide for reliable SRAM performance in times of increased power demand from other components within the system, some of which may be add-on components that are not present when the AR/VR system is initially configured with SRAM. Consequently, corruption or loss of data stored in an SRAM unit may be avoided while, at the same time, permitting the SRAM unit to be operated in conjunction with other power-consuming components. In addition to AR/VR systems, the techniques of this disclosure may also provide similar advantages for low-power devices in other applications, and the disclosure is not limited in this respect.

In some examples, an SRAM array is provided with power switching logic configured to generate a supply voltage for the SRAM array. The power switching logic generates the supply voltage using a first supply rail during an active state and using a second supply rail during a deep retention state. The first supply rail supplies a first voltage, and the second supply rail supplies a second voltage that is lower than the first voltage. The SRAM array may also be provided with a sensing and recovery (SR) unit configured to sense a decrease in the second voltage during the deep retention state and to generate an additional voltage based on the decrease in the second voltage. The additional voltage modifies the supply voltage generated by the power switching logic such that the supply voltage, as modified by the additional voltage, is higher than the decreased second voltage.

In some examples, the SR unit is configured to receive the first voltage from the first supply rail, receive the second voltage from the second supply rail, and generate the additional voltage using the first voltage as received by the SR unit. For example, the SR unit may include a first transistor configured to pass the first voltage, where a gate input of the first transistor is derived from the second voltage as received by the SR unit. Additionally, the SR unit may include a second transistor configured to generate the gate input of the first transistor by passing the second voltage. In some examples, the SR unit is configured to set the gate input of the first transistor such that the first transistor is at least partially conducting during the active state and during the deep retention state.

In some examples, the SR unit is configured to cause the supply voltage to increase toward the first voltage as the second voltage decreases during the deep retention state. Alternatively or additionally, the SR unit may be configured to drive the supply voltage during transitions between the active state and the deep retention state such that the supply voltage is prevented from becoming floating during the transitions.

In some examples, the power switching logic includes a first power gating transistor, a second power gating transistor, and a third power gating transistor. The first power gating transistor is configured to pass the first voltage during the active state. The second power gating transistor is configured to pass the second voltage during the deep retention state. The third power gating transistor is configured to isolate the second power gating transistor from the first voltage during the active state. The power switching logic can be configured such that body diodes of the first power gating transistor, the second power gating transistor, and the third power gating transistor are reverse-biased regardless of an order in which the first voltage and the second voltage are ramped. For example, the first voltage and the second voltage may be ramped such that either the first voltage settles before the second voltage, or the second voltage settles before the first voltage. In such examples, a bulk terminal of the third power gating transistor may be tied to the first voltage. Additionally or alternatively, gate inputs of the first power gating transistor, the second power gating transistor, and the third power gating transistor may be settable to a combination of logic values that keeps the body diodes reverse-biased when the first voltage is higher than the second voltage by at least a turn-on threshold of the body diodes.

In some examples, the SRAM array, the power switching logic, and the SR unit described above may be embedded in an SoC integrated circuit that includes one or more processors configured to access the SRAM array during the active state.

BRIEF DESCRIPTION OF THE DRAWINGS

Illustrative embodiments are described in detail below with reference to the following figures.

FIG. 5A is a timing diagram illustrating the effects of voltage droop and noise during a deep retention state.

FIG. 5B is a timing diagram illustrating attenuation of voltage droop and noise as a result of generating a supply voltage using a sensing and recovery unit configured according to techniques disclosed herein.

FIG. 6A is a timing diagram illustrating the effects of supply voltage failure during a deep retention state.

FIG. 6B is a timing diagram illustrating supply voltage recovery as a result of generating a supply voltage using a sensing and recovery unit configured according to techniques disclosed herein.

FIGS. 7A and 7B are timing diagrams illustrating example supply voltage sequences.

Figure 1:
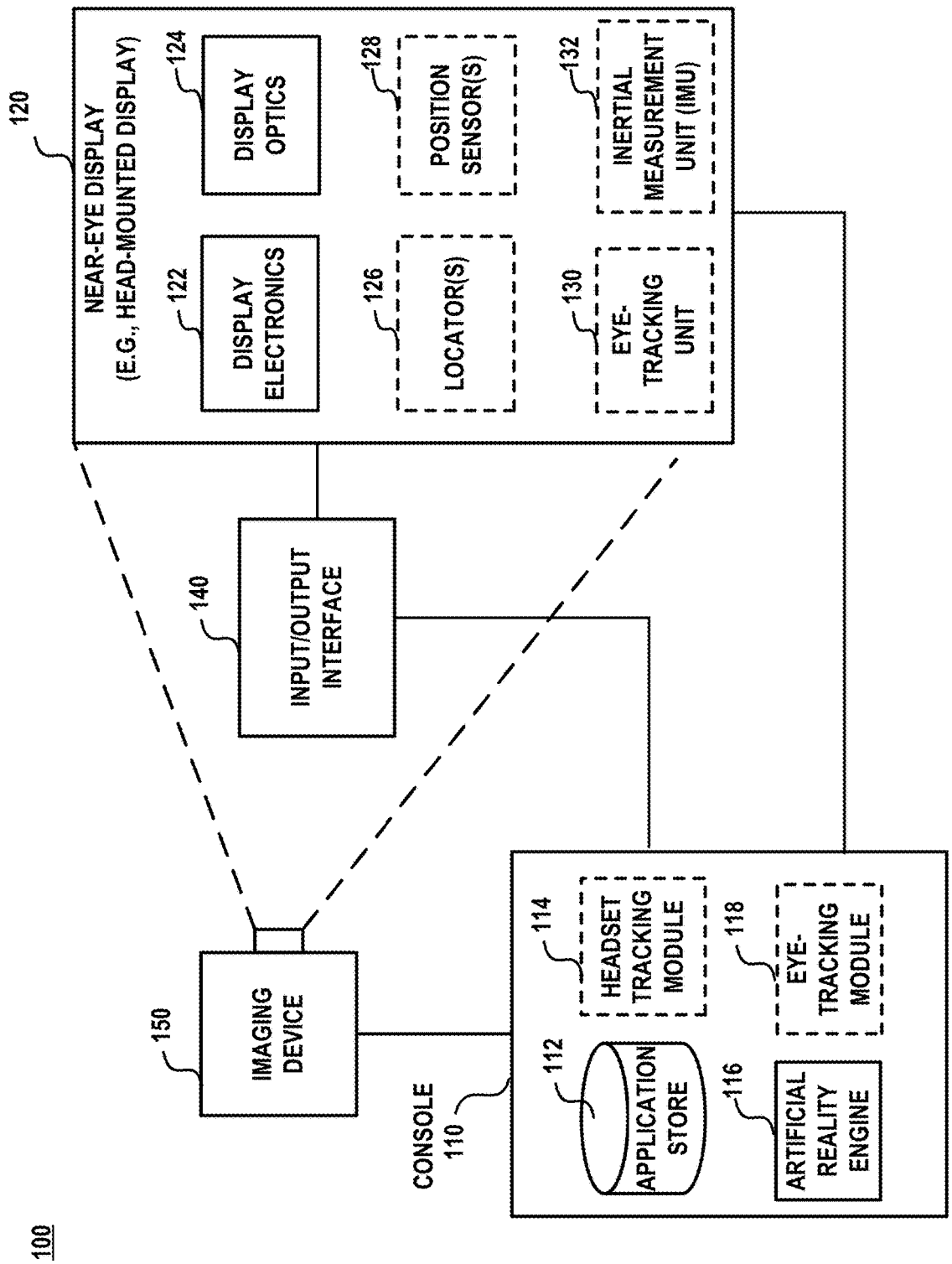
FIG. 1 is a block diagram of an example artificial reality system environment in which one or more embodiments can be implemented.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Static Random-Access Memory (SRAM) leakage can be an issue for artificial reality applications. For example, SRAM power leakage may lead to higher power consumption, decreased battery life, increased battery size, and increased size and/or weight of artificial reality devices implemented using SoCs such as head mounted displays, artificial reality glasses, handheld or wearable peripheral devices, etc. These factors may negatively impact user experience.

Managing power leakage becomes more difficult as the amount of SRAM is increased in order to meet growing performance requirements, e.g., to conserve bandwidth that would otherwise be used for transferring data from off-chip storage. SRAM and other forms of volatile memory consume power even when not being actively used. Existing techniques to reduce power leakage have drawbacks. For example, power-gating (shutting off power to the SRAM) is not always possible because the data contents would be lost. As another example, reducing the voltage of a power supply rail from a higher voltage to a lower voltage is not usually possible as the higher voltage may still be required by other components that are coupled to the same power supply rail.

Some SRAMs feature a "dual rail" design in which a first, relatively higher supply voltage and a second, relatively lower supply voltage are routed through separate supply rails into the SRAM. Accordingly, in some implementations, an SRAM array may be coupled to a controller and power switching logic that switch the SRAM array between different operating modes or states, with each state being associated with a particular operating voltage. For example, the SRAM array may be switched between an "active" state in which a higher voltage (e.g., 0.75V) is supplied to the SRAM array and a "deep retention" state in which a lower voltage (e.g., 0.6V) is supplied to the SRAM array. Aspects of the disclosure relate to arrangements of power-gating devices (e.g., transistors) that can be used to switch between two or more power rails without incurring a significant amount of leakage.

Aspects of the disclosure also relate to robust SRAM operation and protection against data loss or corruption. For instance, techniques are described herein for reducing the effects of fluctuations (e.g., noise or droop) in the voltage signal of a power supply rail during deep retention and/or other times of operation, such as during a transition between the active state and the deep retention state. In some examples, noise and droop rejection is provided through a sensing and recovery unit that enables continued operation of an SRAM array even in the event of complete or near complete failure of a supply voltage, e.g., when the voltage on a supply rail used for deep retention drops to 0V. Additionally, some embodiments may permit the voltages on two or more power supply rails to be ramped up or down in any order without incurring increased power consumption or memory reliability issues.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a block diagram of an example artificial reality system environment 100 in which one or more embodiments can be implemented. Artificial reality system environment 100 includes a near-eye display 120, an imaging device 150, and an input/output interface 140, each of which may be coupled to a console 110. While FIG. 1 shows an example of artificial reality system environment 100 including one near-eye display 120, one imaging device 150, and one input/output interface 140, any number of these components may be included in artificial reality system environment 100, or any of the components may be omitted. For example, there may be multiple near-eye displays 120 monitored by one or more imaging devices 150 in communication with console 110. In some implementations, artificial reality system environment 100 may not include imaging device 150, input/output interface 140, and/or console 110. In other implementations, components not depicted (e.g., different and/or additional components) may be included in artificial reality system environment 100.

Near-eye display 120 may be a head-mounted display (HMD) that presents content to a user. Examples of content that can be presented by near-eye display 120 include images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may be implemented in any form-factor suitable for a particular application, including as a pair of glasses. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to the user.

In various embodiments, near-eye display 120 may include display electronics 122, display optics 124, and/or an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, various elements shown in FIG. 1 may be combined into a single element in some embodiments.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display type. In one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels that emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

Display optics 124 may direct image light received from the display electronics 122 (e.g., using optical waveguides and couplers), magnify the image light, correct optical errors associated with the image light, and present the corrected image light to a user of near-eye display 120. In various embodiments, display optics 124 may include one or more optical elements, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain a relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be farther from the user's eyes than the near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nanometers (nm) to 750 nm), in the infrared (IR) band (e.g., about 750 nm to 1 millimeter (mm)), in the ultraviolet band (e.g., about 10 nm to about 380 nm), in another portion of the electromagnetic spectrum, or in any combination of portions of the electromagnetic spectrum.

Imaging device 150 may include one or more cameras, one or more video cameras, any other device capable of capturing images including one or more of locators 126, or any combination thereof. Additionally, imaging device 150 may include one or more filters (e.g., to increase signal to noise ratio). Imaging device 150 may be configured to detect light emitted or reflected from locators 126 in a field of view of the imaging device 150. In embodiments where locators 126 include passive elements (e.g., retroreflectors), the imaging device 150 may include a light source that illuminates some or all of locators 126, which may retro-reflect the light to the light source in imaging device 150. Slow calibration data may be communicated from the imaging device 150 to console 110, and the imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 include accelerometers, gyroscopes, magnetometers, other motion-detecting or error-correcting sensors, or any combination thereof. In some embodiments, position sensors 128 may include multiple accelerometers to measure translational motion (e.g., forward/back, up/down, or left/right) and multiple gyroscopes to measure rotational motion (e.g., pitch, yaw, or roll).

IMU 132 may be an electronic device that generates fast calibration data based on measurement signals received from one or more position sensors 128. Position sensors 128 may be located external to IMU 132, internal to IMU 132, or both externally and internally. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye relative to near-eye display 120. An eye-tracking system may include an imaging system to image one or more eyes and may optionally include a light emitter, which may generate light that is directed to an eye such that light reflected by the eye is captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130).

Near-eye display 120 may use the orientation of the eye to, e.g., determine an inter-pupillary distance (IPD) of the user, determine gaze direction, introduce depth cues (e.g., blur an image outside of the user's main line of sight), collect information on user interactions (e.g., time spent on any particular subject, object, or frame as a function of exposed stimuli), and/or perform other operations based on the orientation of at least one of the user's eyes. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be configured to allow a user to send action requests to console 110. For example, an action request may be to start or to end a software application or to perform a particular action within the software application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received or when console 110 has performed a requested action. In some embodiments, an imaging device 150 may be used to track the input/output interface 140 and/or track the user's hand movement. For example, near-eye display 120 may include an imaging device 150 that tracks the location or position of a hand-held controller (e.g., using a light source on the controller) so that the user's hand movement can be inferred from changes in the location or position of the controller.

Console 110 may provide content to near-eye display 120 for presentation to the user in accordance with information received from imaging device 150, near-eye display 120, and/or input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functionality may also be distributed among components of console 110 in a different manner than is described here.

One or more components of the artificial reality system environment 100 (e.g., the console 110) may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions that, when executed by the processor, cause the processor to perform operations in accordance with the techniques described herein.

In general, any component in the artificial reality system environment 100 that processes data may include one or more processing units and/or one or more memory devices. Besides the console 110, such components may include the near-eye display 120, the input/output interface 140, and/or the imaging device 150. Examples of processing units include a central processing unit (CPU), a graphics processing unit (GPU), a field programmable gate array (FPGA), and integrated circuits. In some embodiments, at least some processing units are implemented as SoCs. For example, console 110 and near-eye display 120 may each include one or more SoCs operating as co-application processors, sensor aggregators, display controllers, encryption/decryption engines, hand/eye/depth tracking and pose computation elements, video encoding and rendering engines, communication control components, and/or the like. In one example, near-eye display 120 may include a first SoC operating as a display controller for a left display, a second SoC operating as a display controller for a right display, and a third SoC operating as the eye-tracking unit 130.

Memory accessed by a processing unit in the artificial reality system environment 100 can include volatile memory and/or non-volatile memory. For example, an SoC may include one or more on-chip SRAM units (e.g., one or more arrays of SRAM bit cells). In some embodiments, at least some SRAM units may be provided with power switching logic (PSL) configured to switch the SRAM unit between different states such as an active state and a deep retention state. The PSL can be an on-chip PSL that is integrated into the SoC. Alternatively, some embodiments may include an off-chip PSL. Each state may correspond to a different operating mode that has a corresponding operating voltage. The operating voltage can vary across states, e.g., with the active state using a higher supply voltage and the deep retention state using a lower supply voltage. Accordingly, as part of switching an SRAM unit between states, a PSL may be configured to transition the power supply of the SRAM unit from a first supply voltage to a second supply voltage. Multiple SRAM units can be in different states concurrently. For example, in some instances the console 110 may be operating in a sleep or low-power mode, in which case a PSL in the console 110 may cause SRAM of the console 110 to go into the deep retention state. Concurrently, the near-eye display 120 may be interacting with the user (e.g., presenting audio and/or video), in which case a PSL in the near-eye display 120 may keep SRAM of the near-eye display 120 in the active state. As described in connection with FIG. 2 below, a PSL can transition the power supply of an SRAM unit through deriving a virtual supply voltage from the voltage provided by one or more supply rails. In this manner, the voltage input to an SRAM unit can be varied without adjusting the voltage at the supply rails. This would allow other components that are connected to the supply rails to continue receiving the supply rail voltage.

Application store 112 may store one or more applications for execution by console 110. An application may include instructions that, when executed by a processor, generates content for presentation to the user. Content generated by an application may be in response to inputs received from the user via movement of the user's eyes or inputs received from the input/output interface 140. Examples of applications that may be in the application store 112 include gaming applications, conferencing applications, video playback applications, and/or other applications suitable for execution in an artificial reality environment.

Headset tracking module 114 may track movements of near-eye display 120 using slow calibration information from the imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future position of near-eye display 120. Headset tracking module 114 may provide the predicted position of the near-eye display 120 to the artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140 and provide feedback to the user indicating that the action has been performed. The feedback may be visual or audible feedback presented via near-eye display 120 or haptic feedback presented via input/output interface 140.

Eye-tracking module 118 may receive eye-tracking data from eye-tracking unit 130 and determine the position of the user's eye based on the eye tracking data. Eye position may include an eye's orientation, location, or both relative to near-eye display 120 or any element thereof. In addition or as an alternative to eye tracking and headset tracking, one or more components of the artificial reality system environment 100 may be configured to track other features of the user and/or aspects of the physical environment external to near-eye display 120.

Figure 2:
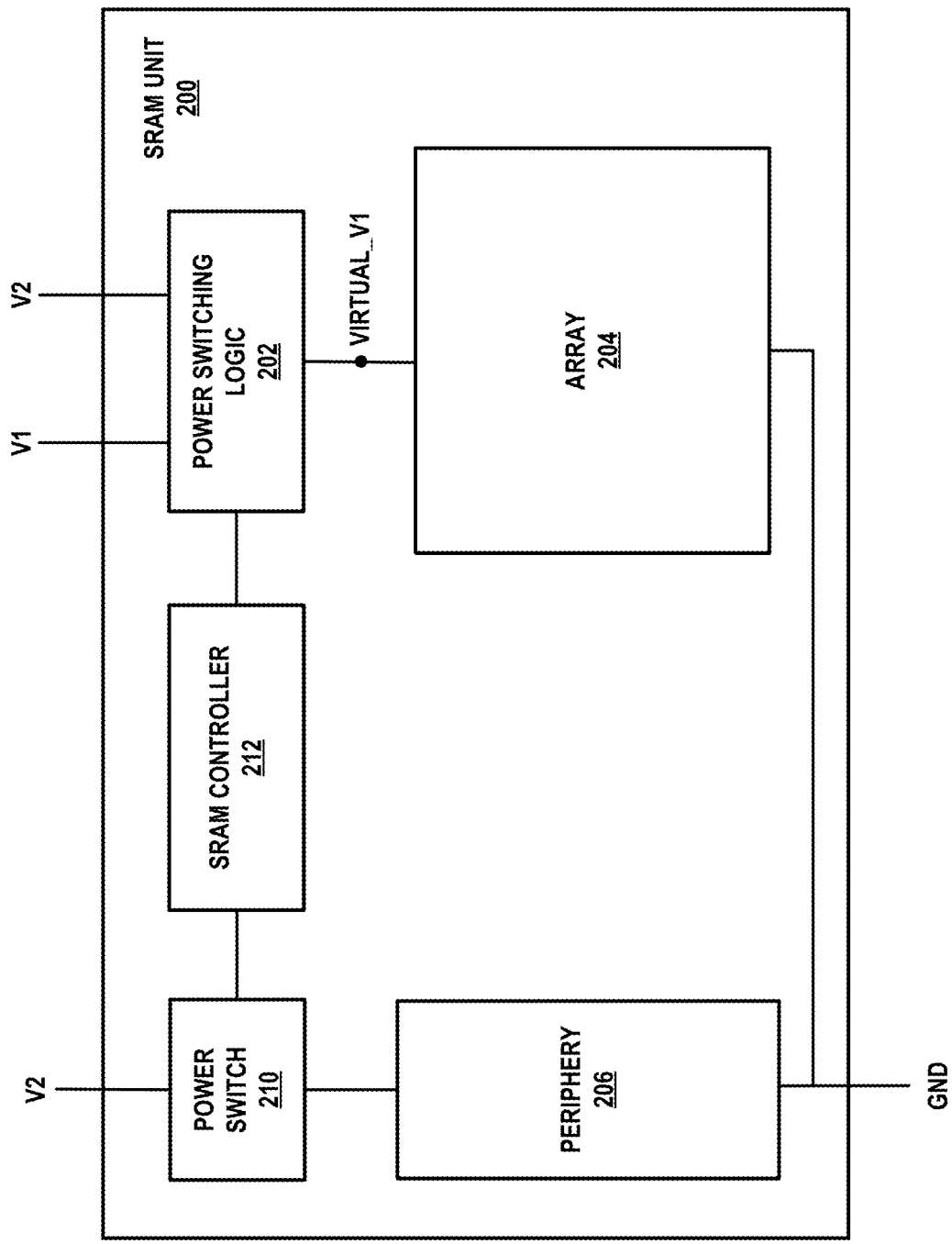
FIG. 2. is a block diagram of an example SRAM unit according to certain embodiments.

FIG. 2 is a block diagram of an example SRAM unit 200 according to certain embodiments. SRAM unit 200 may be used to implement SRAM in one or more components of the artificial reality system environment 100 of FIG. 1, for example, as part of an SoC in the console 110 or the near-eye display 120. SRAM unit 200 includes power switching logic 202, an SRAM array 204, periphery logic 206, a power switch 210, and an SRAM controller 212. Although only one SRAM array 204 is shown, SRAM unit 200 may include multiple arrays that form ranks, banks, and/or other subdivisions of memory. Each SRAM array 204 includes bit cells arranged in rows and columns. A bit cell can be individually addressed through asserting a corresponding row (e.g., a word line) and a corresponding column (e.g., a bit line or bit line pair). Various bit cell designs exist, some of which are based on cross-coupled CMOS (complementary metal-oxide-semiconductor) inverters.

In some embodiments, a bit cell may include a pair of cross-coupled inverters connected to a bit line (BL) and a complementary bit line (BLB or bit line bar) through pass transistors, with the gates of the pass transistors being connected to a corresponding word line. Both inverters may be connected between a word line supply voltage and ground. In general, SRAM is a type of volatile memory in which data is lost when power is removed. For example, the cross-coupled inverters may retain a value written into the bit cell as long as the word line supply voltage continues to be applied, but the value will be lost if the word line supply voltage drops to 0V or close to 0V. Therefore, SRAM array 204 may require at least a minimum data retention voltage to be applied in order to retain the data stored in the bit cells. In addition, SRAM array 204 may also have an optimal operating voltage or optimal range of operating voltages at which data read/write errors are minimized.

Periphery logic 206 controls read/write functions of the SRAM array 604 and includes, for example, address logic for row and column selection, timing logic (e.g., clock circuitry) to control the timing of read and write operations, write logic (e.g., a write-enable controller), control logic, etc. Thus, the periphery logic 206 may be configured to generate a row address strobe signal, a word line select signal, a column select signal, a write-enable signal, a read-enable signal, and/or the like. The periphery logic 206 may generate such signals based on inputs to the SRAM unit 200, for example, an encoded address corresponding to one or more bit cells and a data value to be written to the one or more bit cells, where the encoded address and the data value are generated by a processing unit as part of executing a software application. The periphery logic 206 is typically enabled during accesses to the SRAM array 604 and disabled during times when the SRAM array 604 is not being accessed.

In the example of FIG. 2, the SRAM unit 200 is supplied with a first voltage V1 and a second voltage V2, with V1 being higher than V2 (e.g., V1=0.75V and V2=0.6V). The voltages V1 and V2 are supplied through respective power supply rails, for instance, supply rails of an SoC containing the SRAM unit 200. The power supply rails may be coupled to one or more power delivery networks responsible for distributing V1 and V2 to SRAM unit 200 and other components that operate on these supply voltages. Accordingly, the power source that generates V1 or V2 may be external to SRAM unit 200 or external to the SoC containing SRAM unit 200.

Power switching logic 202 is supplied with V1 and V2 as inputs and is configured to generate a voltage VIRTUAL_V1 as an input voltage to the SRAM array 204. The power switching logic 202 derives VIRTUAL_V1 using V1 or V2 depending on the state of the SRAM array 204. For instance, power switching logic 202 may output V1 at VIRTUAL_V1 when the SRAM array 204 is in the active state and output V2 at VIRTUAL_V1 when the SRAM array 204 is in the deep retention state. Accordingly, the power switching logic 202 may be configured to switch the voltage supplied to the SRAM array 604 between V1 and V2 in connection with transitioning the SRAM array 204 from the active state to the deep retention state or vice versa.

Other components may be coupled to V1 or V2 besides the SRAM array 204. For example, FIG. 2 shows V2 being input to the power switch 210. In the active state, V2 may be supplied to periphery logic 206 via the power switch 210 while power switching logic 202 supplies V1 to the SRAM array 204. In general, the bit cells of the SRAM array 204 require a higher active operating voltage than the periphery logic 206, and therefore V1 is a relatively higher voltage than V2. As discussed above, V1 may be 0.75V and V2 may be 0.6V. However, other voltages may also be used, and the disclosure is not limited in this respect.

Logic residing external to the SRAM unit 200 may also be coupled to V1 and/or V2. Such logic may be located on the same SoC as the SRAM unit 200 or on a separate SoC and can include CPUs, GPUs, FPGAs, neural network accelerators, and/or other processing elements. In some implementations, V1 may be a dedicated supply voltage for SRAM array 204 (and possibly arrays in other SRAM units), while V2 is the operating voltage for logic external to SRAM unit 200. For example, the near-eye display 120 in FIG. 1 may include an SoC containing SRAM unit 200 and a CPU, where V1 is for reading/writing the SRAM array 204, and where V2 is the operating voltage for the CPU and other logic outside the SRAM unit 200. Accordingly, V2 may sometimes be referred to herein as a "logic supply voltage." Because other components may be coupled to the same power supply rails as SRAM unit 200, such components can potentially contribute to noise (e.g., crosstalk or signal interference) that manifests as fluctuations in the voltage level of V1 or V2 as supplied through the power supply rails.

To switch from the active state to the deep retention state, power switch 210 may disconnect periphery logic 206 from V2. In conjunction with the disconnection of periphery logic 206 from V2, the power switching logic 202 may switch the voltage supplied to the SRAM array 204 at VIRTUAL_V1 from V1 to V2. Conversely, to switch from the deep retention state to the active state, power switch 210 may connect periphery logic 206 to V2. In addition, power switching logic 202 may switch the voltage supplied to the SRAM array 204 at VIRTUAL_V1 from V2 to V1. Accordingly, the SRAM unit 200 may toggle between states, and the states may differ with respect to the voltage supplied to the SRAM array 204 and/or other components (e.g., periphery logic 206) of the SRAM unit 200.

In some embodiments, SRAM unit 200 may be placed into additional states besides the active and deep retention states. For example, SRAM unit 200 may support a "power-down" state in which no voltage is output at VIRTUAL_V1. Further, some embodiments may feature multiple retention states. For instance, the SRAM array 204 may sometimes be placed into a "retention" state in which V1 is output at VIRTUAL_V1. As described below in connection with FIGS. 3A to 3C, the retention state and the active state may differ with respect to the configuration of a sensing and recovery unit that is optionally part of the power switching logic 202, even though V1 is supplied to SRAM array 204 in both the active state and the (non-deep) retention state.

Controller 212 determines which state the SRAM unit 200 should be in at any given time. More generally, the controller 212 can determine the supply voltage for individual components within the SRAM unit 200. In this regard, controller 212 can generate control signals for the power switching logic 202 and the power switch 210. The control signals generated by the controller 212 may include, for example, signals that are received at the inputs of power-gating devices (e.g., the gates of transistors) in the power switching logic 202 and the power switch 210. Each SRAM unit 200 may include its own controller 212 so that the SRAM unit 200 individually determines which state to be in. The controller 212 may determine when to transition from one state to another state through appropriate timing of the control signals. Alternatively, in some embodiments, control signals may be supplied by or generated under instructions from a centralized power management controller. The centralized power management controller can be external to the SRAM unit 200 (e.g., on another SoC) and may coordinate state transitions across SRAM units. In this manner, multiple SRAM units 200 can be placed into the same state concurrently or into a combination of different states, thorough communication with a shared controller.

Using different supply voltages over the course of memory operation has certain advantages. Since V2 is lower than V1, the power leakage in the SRAM array 204 is reduced in the deep retention state compared to the power leakage in the active state. Generating the supply voltages as a virtual supply voltage, at VIRTUAL_V1 and using power switching logic 202, is also advantageous since V1 and V2 can be supplied to the SRAM unit 200 through existing supply rails without relying on additional supply voltages, voltage convertor circuitry, or supply line traces. The use of power switching logic 202 may also be preferable over conventional "diode-drop" solutions because power leakage resulting from the inherent resistance of a diode-drop circuit can significantly offset any power leakage savings in the SRAM array.

Figure 3A:
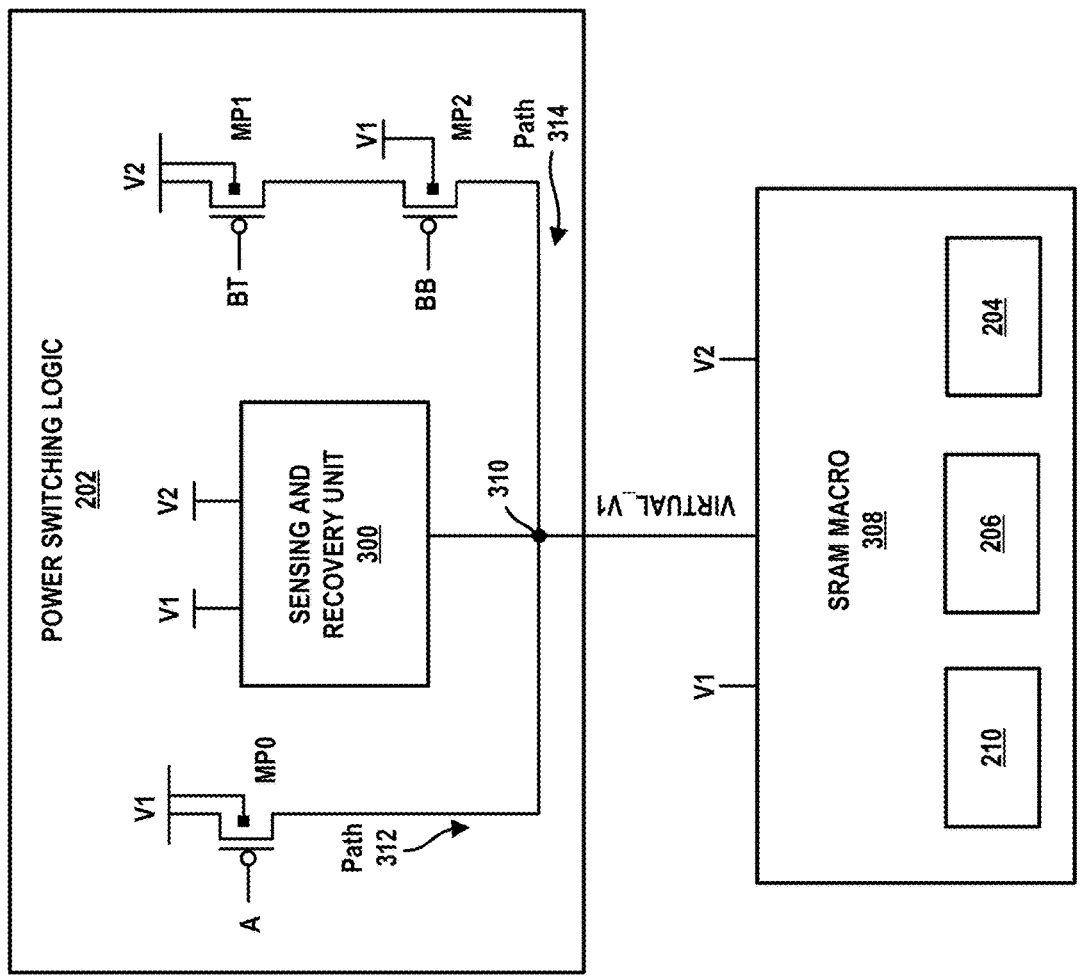
FIG. 3A is a block diagram of example power switching logic according to certain embodiments.

FIG. 3A is a block diagram showing an example implementation of power switching logic 202. In FIG. 3A, the power switching logic 202 is configured to supply VIRTUAL_V1 to an SRAM macro 308. The SRAM macro 308 includes SRAM array 204, periphery logic 206, and power switch 210 as shown in FIG. 2. The voltages V1 and V2 are supplied to SRAM macro 208 and power switching logic 202 as direct inputs. In other words, the SRAM macro 208 and the power switching logic 202 are both coupled to the supply rails that provide V1 and V2. In addition to V1 and V2, the SRAM macro 208 also receives VIRTUAL_V1 at a node 310 connecting the power switching logic 202 to the SRAM macro 208. As discussed above in conjunction with FIG. 2, the power switching logic can set the voltage at VIRTUAL_V1 to V1 or V2 depending on the state, e.g., V1 during the active state and V2 during the deep retention state.

In the example of FIG. 3A, power switching logic 202 includes three power-gating devices: a first transistor MP0, a second transistor MP1 and a third transistor MP2. In this example, MP0, MP1, and MP2 are PMOS (P-channel metal-oxide-semiconductor) transistors. However, other types of power-gating devices may also be suitable for use in place of PMOS transistors. Each transistor MP0, MP1, and MP2 includes four terminals: a source terminal, a drain terminal, a gate (enable) terminal, and a bulk terminal. The source of transistor MP0 is connected to V1, and the source of transistor MP1 is connected to V2. The source of transistor MP2 is connected to the drain of transistor MP1. The drains of transistors MP0 and MP2 are tied together at the node 610, where VIRTUAL_V1 is generated as an output of the power switching logic 202 and supplied to SRAM macro 608.

In addition to the source and drain connections, FIG. 3A shows the bulk connections for the transistors MP0, MP1, and MP2. The bulk (sometimes referred to as the body or substrate) in a PMOS transistor is an n-well region. The n-well of transistor MP0 is tied to V1, the n-well of transistor MP1 is tied to V2, and the n-well of transistor MP2 is tied to V1. As described below in conjunction with FIG. 7, this configuration of the source, drain, and bulk terminals enables flexible supply sequencing by virtue of permitting V1 and V2 to be ramped up or down in any order relative to each other without causing forward-biasing of the parasitic diodes (also known as body diodes) that are formed between the bulk and the source/drain of each transistor. Forward-biasing increases power consumption. Forward-biasing can also lead to memory reliability issues over time. For example, damage to the transistors MP0, MP1, and MP2 due to periodic or intermittent forward-biasing over the course of months or years may render power switching logic 202 inoperable.

Each transistor is controlled through applying a respective control signal to the gate of the transistor. The gate of transistor MP0 is coupled to a first control signal (A). The gate of transistor MP1 is coupled to a second control signal (BT). The gate of transistor MP1 is coupled to a third control signal (BB). The control signals A, BT, and BB can be set to different combinations of logic values in order to configure the manner in which VIRTUAL_V1 is generated. In some examples, the control signals A, BT, and BB are supplied by an SRAM controller embedded on each SRAM unit, such as SRAM controller 212 in FIG. 2. In other examples, the control signals are supplied by a controller external to the SRAM unit, for example, a centralized power management controller on the same SoC as the SRAM unit or on a different SoC.

Transistor MP0 provides a first path 312 that supplies V1 at the node 310 when the transistor MP0 is turned on via the control signal A, e.g., during the active state. Transistors MP1 and MP2 provide a second path 314 to supply V2 at the node 310, when MP1 and MP2 are turned on via the control signals BT and BB, e.g., during the deep retention state.

As shown in FIG. 3A, power switching logic 202 may further include a sensing and recovery (SR) unit 300 that has an output connected to the node 310. The SR unit 300 is supplied with V1 and V2 and is configured to reduce the effects of fluctuations in the voltages provided by the supply rails, e.g., noise or droop in V1, in V2, or in both V1 and V2.

For example, SR unit 300 may provide a degree of noise rejection and also prevent excessive droop at VIRTUAL_V1.

In some examples, SR unit 300 operates as a supply recovery mechanism to prevent VIRTUAL_V1 from falling to a level that would result in corruption or loss of data stored in the bit cells of SRAM array 204. For instance, the SR unit 300 may be configured to "pull up" the voltage at the node 310 when V2 fails (drops to 0V or close to 0V) during the deep retention state. To pull up the voltage at the node 310, the SR unit 300 can cause VIRTUAL_V1 to temporarily revert to the voltage V1 by generating, at the output of SR unit 300, an additional voltage at the node 310. An example implementation of the SR unit 300 is described below with respect to FIGS. 3B and 3C.

Figures 3B, 3C:
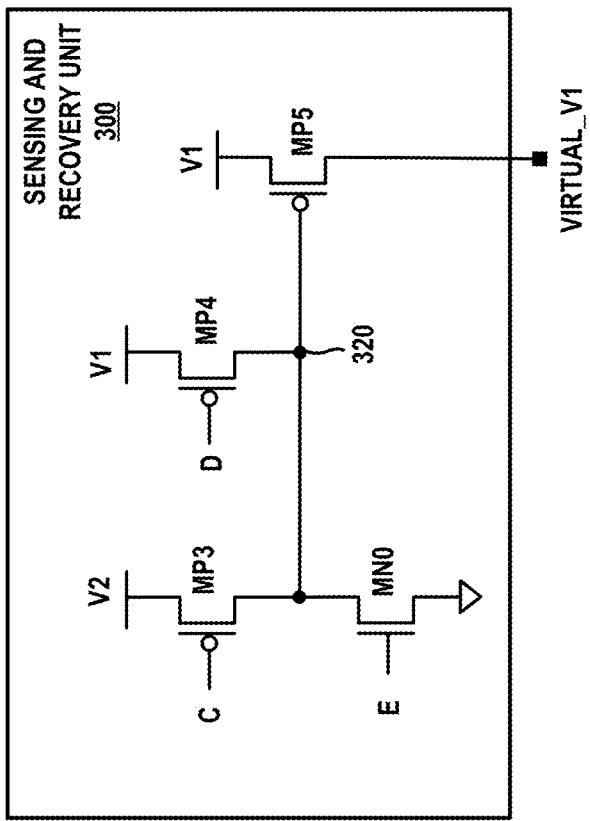
FIG. 3B is a schematic diagram showing a circuit-based implementation of a sensing and recovery unit according to certain embodiments.
FIG. 3C shows a table of example values for control signals in FIGS. 3A and 3B.

FIG. 3B is a schematic diagram showing a circuit-based implementation of the SR unit 300. In the example of FIG. 3B, the SR unit 300 includes four CMOS transistors: a first transistor MP3, a second transistor MN0, a third transistor MP4, and a fourth transistor MP5. Transistors MP3, MP4, and MP5 are PMOS. Transistor MN0 is NMOS. As with the transistors MP0, MP1, and MP2 in FIG. 3A, other types of power-gating devices may be used in place of MP3, MP4, MP5, and MN0 in some embodiments.

The source of transistor MP3 is connected to V2, and the sources of transistors MP4 and MP5 are connected to V1. The drain of transistor MN0 is connected to the drain of transistor MP3. The drains of transistors MP3 and MP4 are tied together at a node 320, which is connected to the gate of transistor MP5. The source of transistor MN0 is tied to ground, and the drain of transistor MP5 leads to VIRTUAL_V1, i.e., to the node 310 in FIG. 3A.

The gate of transistor MP3 is coupled to a first control signal (C). The gate of transistor MP4 is coupled to a second control signal (D). The gate of transistor MN0 is coupled to a third control signal (E). Example values for the control signals C, D, and E during different states are shown in FIG. 3C.

FIG. 3C shows a table 350 of example values for the control signals in FIGS. 3A and 3B. The values are expressed in terms of logic high (1) and logic low (0), with the voltage levels that are associated with high and low depending on implementation. For example, logic high may correspond to 0.75V and logic low may correspond to 0V when V1 and V2 are 0.75V and 0.6V, respectively. The table 350 includes possible value combinations for the active state, the retention state, the deep retention state, and the power-down state. The number of states supported can vary. For instance, some implementations may feature an additional state into which V2 is lowered to 0V to prevent power leakage, e.g., to prevent leakage from periphery logic 206. In the active state, the values of the control signals A, BT, and BB are 0, 1, and 1, respectively. Referring back to FIG. 3A, this means that MP0 is on while MP1 and MP2 are off. Accordingly, in the active state, transistor MP0 supplies V1 through the path 312 such that VIRTUAL_V1 is substantially equal to V1. Additionally, with transistor MP2 being off during the active state, MP2 isolates MP1 from VIRTUAL_V1 (i.e., from V1 as supplied through MP0) such that the n-well of transistor MP1 is not biased lower than the drain of MP1. Thus, MP2 can keep a body diode of MP1 from becoming forward-biased during the active state.

In the (non-deep) retention state, the logic values of the control signals A, BT, and BB are identical to the values in the active state so that MP0 continues to supply V1 through the path 312. In contrast, during the deep retention state, the logic values of the control signals A, BT, and BB are 1, 0, and 0, respectively. Accordingly, in the deep retention state, the transistors MP1 and MP2 supply V2 through the path 314 such that VIRTUAL_V1 is substantially equal to V2. In some examples, the retention state is used in situations where a shorter wakeup time (transition back to active state) is preferred, whereas the deep retention state may be used in situations where increased power savings is preferred at the cost of a longer wakeup time.

In the power-down state, the logic values of the control signals A, BT, and BB in the retention state are 1, 1, and 0, respectively. Thus, MP0 and MP1 are off while MP2 is on so that VIRTUAL_V1 is decoupled from V1 and V2. Based on table 350, it will be apparent that the transistors MP0 and MP2 are controlled separately, with the control signals A and BB being set to opposite values during each of the states shown in the table. Separate control of transistors facilitates flexible supply sequencing, which is described in further detail below.

Having described the general operation of the power switching logic 202 during each of the states listed in the table 350, the discussion now turns to the operation of the SR unit 300. In the active state, the logic values of the control signals C, D, and E are all 1 so that the transistors MP3 and MP4 are off while transistor MN0 is on. Consequently, the gate of MP5 is logic low (e.g., 0V) so that MP5 is on, thereby providing an alternate path to V1 during the active state.

In the retention state, the logic values of the control signals C, D, and E are 1, 0, and 0, respectively. Thus, MP3 and MN0 are off while MP4 is on. Consequently, the gate of MP5 is logic high (e.g., approximately 0.75V) so that MP5 is off. Accordingly, the retention state differs from the active state in that SR unit 300 does not provide an alternate path to V1 during the retention state.

In the deep retention state, the logic values of the control signals C, D, and E are 0, 1, and 0, respectively. Thus, MP3 is on while MP4 and MN0 are off, and the voltage at the gate of MP5 is close to V2 (e.g., approximately 0.6V). In this instance, the gate voltage of MP5 is below logic high and above logic low, so transistor MP5 is on, but the current flowing through MP5 will be less than if the gate voltage was logic low. MP5 is therefore configured to provide a weak-current path to V1 during deep retention. Further, as discussed below in conjunction with FIG. 4, this configuration of the SR unit 300 during the deep retention state creates negative feedback between VIRTUAL_V1 and V2 such that if V2 droops, the droop in V2 is sensed by transistor MP3 to pull up VIRTUAL_V1 using transistor MP5, with the result being that the droop in VIRTUAL_V1 will be less than the droop in V2.

In the power-down state, the logic values of the control signals C, D, and E are all 0. Thus, MP3 and MP4 are on while MN0 is off. Consequently, the gate of MP5 is logic high so that MP5 is off.

Figure 4:
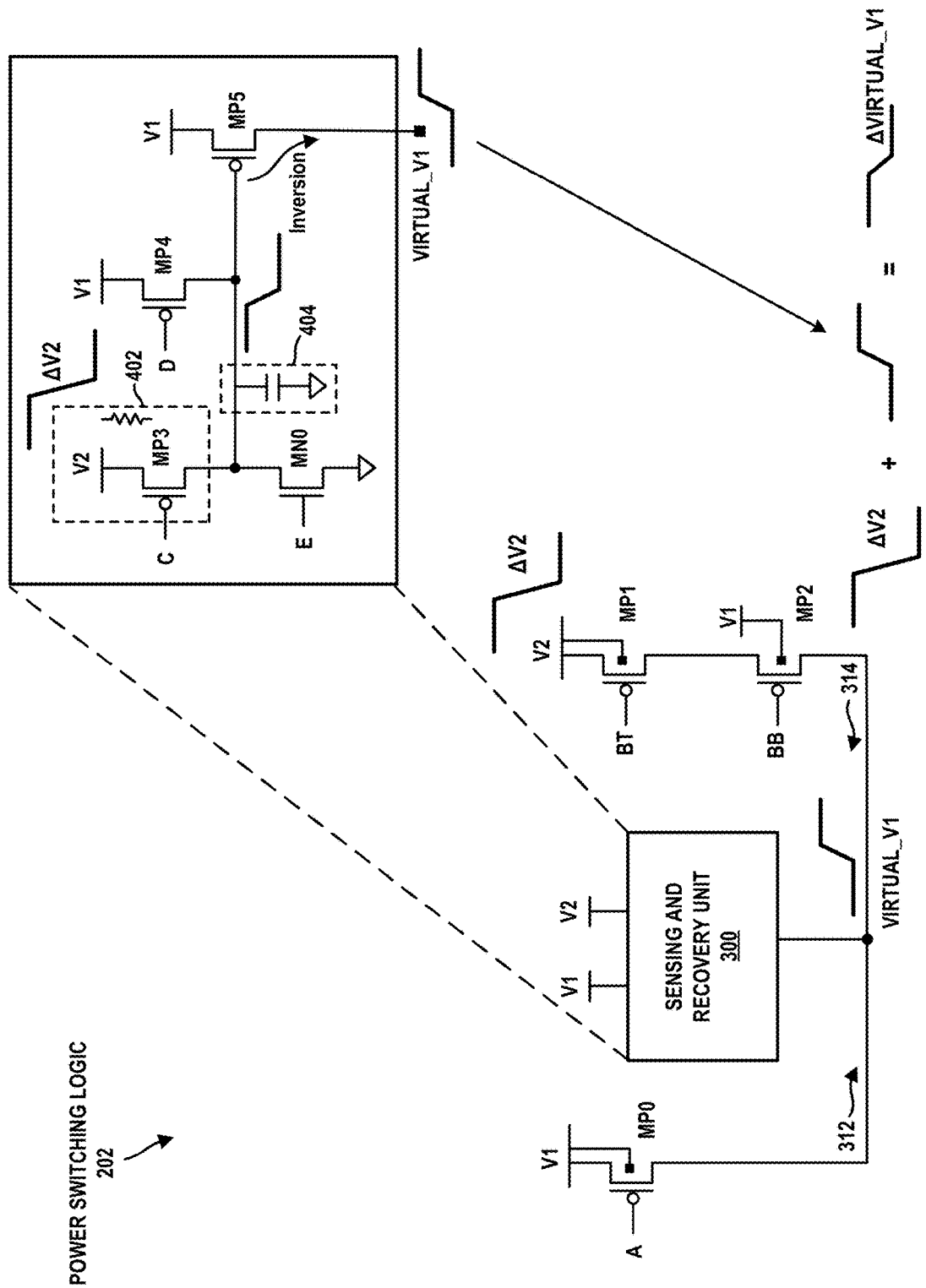
FIG. 4 illustrates droop rejection based on the examples of FIGS. 3A to 3C.

FIG. 4 illustrates droop rejection based on the examples of FIGS. 3A to 3C. In particular, FIG. 4 shows droop rejection by the power switching logic 202 during the deep retention state. As discussed above, transistors MP1 and MP2 supply V2 through the path 314 during deep retention. In the absence of SR unit 300, the voltage of VIRTUAL_V1 will be substantially equal to V2 so that any droop in V2 (shown in the figure as a voltage drop of magnitude ΔV2) will produce a corresponding amount of droop in VIRTUAL_V1. To compensate for this droop, the SR unit 300 is configured to generate a voltage that is inversely proportional to the droop in V2. As shown in the inset image, ΔV2 is reflected in the voltage at the drain of transistor MP3. As V2 decreases, so does the voltage at the drain of MP3 and, therefore, the voltage at the gate of transistor MP5. When there is no droop in V2, transistor MP5 is mostly off, i.e., weakly conducting. However, as V2 decreases, transistor MP5 will start to turn on more, becoming increasingly conducting in correspondence with the decrease in V2. The voltage at the drain of MP5 will become approximately equal to V1 when MP5 is fully on. Thus, the SR unit 300 adds negative feedback between VIRTUAL_V1 and V2 through inversion of the voltage across the gate and the drain of transistor MP5. This negative feedback at least partially offsets the droop in V2 so that the resulting droop in VIRTUAL_V1 (shown as ΔVIRTUAL_V1) is less than ΔV2.

SR unit 300 may also provide a degree of resistor-capacitor (RC) based noise filtering. As shown in FIG. 4, transistor MP3 provides a resistive path to V2, which can be modeled as a resistor 402. Additionally, the transistors in SR unit 300 are capacitively coupled, which can be modeled as a capacitor 404. The sizes of the resistor 402 and the capacitor 404 depend on the sizes of the transistors, e.g., the aspect ratio (width to length) of transistor MP3 and the aspect ratio of transistor MP5. Accordingly, the RC time constant of the SR unit 300 can be tuned to filter out noise of certain frequencies. With appropriate sizing of the transistors, the SR unit 300 can be configured to provide better rejection of certain frequency components of noise, as reflected in the contribution of SR unit 300 to VIRTUAL_V1 at the drain of transistor MP5.

The RC time constant can also used to configure the speed at which SR unit 300 responds to noise or droop. For instance, assuming the resistor 402 were 0 ohms, then SR unit 300 would respond essentially instantaneously to any change in V2. Although a faster response time is generally preferred, this would incur increased power consumption due to more current being drawn through the transistors. Accordingly the sizes of MP3, MP5, and/or other transistors in SR unit 300 may be configured to achieve a desired tradeoff between power consumption and speed of noise or droop rejection.

The operation of the SR unit 300 was described above with respect to rejection/attenuation of noise and droop in V2. Although the implementation shown in FIG. 3B is not specifically designed to handle noise and droop with respect to V1, the SR unit 300 may, in other implementations, be configured to apply similar techniques, e.g., using negative feedback, to at least partially offset noise/droop in V1. Depending on the operating environment, the example of FIG. 3B may provide sufficient protection for SRAM array 204 even without being configured to handle noise and droop in V1. As mentioned above, V1 may be a dedicated supply voltage for memory, whereas V2 may be a logic supply voltage used by logic outside the SRAM unit 200. Therefore, V1 may be less susceptible to noise compared to V2 since the load on V1 is less variable. Additionally, the power delivery network for V1 may, in some implementations, be significantly more robust compared to the power delivery network for V2. As such, V1 is generally much more stable compared to V2.

FIG. 5A is a timing diagram illustrating the effects of voltage droop and noise during the deep retention state and in the absence of means for rejecting or attenuating such droop/noise. FIG. 5A depicts a scenario in which both noise and droop are present. However, there may be times when a supply voltage experiences noise but not droop, or vice versa. In any case, noise/droop is observed as a fluctuation in the voltage level of the supply voltage, e.g., swings in the voltage level of V2. Noise tends to involve higher frequency changes in the supply voltage. In contrast, droop usually involves a sustained drop in voltage. Therefore, droop can be considered a low frequency form of noise. Depending on the severity of the noise or droop (e.g., the amount of voltage decrease and/or the duration of the voltage decrease), the contents of SRAM array 204 may become corrupted.

At time T0, the SRAM unit 200 is in deep retention and operating using V2 as the supply voltage. The voltage V2 is supplied in the form of VIRTUAL_V1, e.g., as the output of the power switching logic 202. At T0, V2 is relatively stable, with low droop and low noise. At time T1, V2 begins to experience droop (characterized by an overall drop in voltage level) as well as noise. The noise is characterized by voltage fluctuations that are relatively small compared to the droop but also comparatively more frequent. At time T2, V2 stabilizes and reverts back to its nominal voltage level (e.g., 0.6V). Assuming power switching logic 202 is implemented without the SR unit 300, VIRTUAL_V1 will experience a similar level of droop and noise during the time period between T1 and T2. VIRTUAL_V1 would change in correspondence with the changes in V2 because VIRTUAL_V1 is generated through the path 314 during the deep retention state, via the connection between V2 and the source terminal of transistor MP1. Consequently, the data stored in SRAM array 204 may become corrupted as early as time T1 and will remain corrupted even after V2 stabilizes at time T2.

FIG. 5B is a timing diagram illustrating attenuation of voltage droop and noise as a result of generating VIRTUAL_V1 using an SR unit configured according to techniques disclosed herein, e.g., SR unit 300. In FIG. 5B, V2 undergoes the same changes as in FIG. 5A, experiencing droop and noise during the time period between T1 and T2. Despite these voltage changes, the droop and noise are substantially attenuated, as observed at VIRTUAL_V1. As shown in FIG. 5B, the voltage level of VIRTUAL_V1 may still fluctuate during the time period between T1 and T2 but to a significantly smaller degree compared to FIG. 5A. Consequently, VIRTUAL_V1 can be kept sufficiently close to the nominal level of V2 (e.g., 0.6V) throughout the entire duration of T1 to T2. The data stored in SRAM array 204 may therefore be retained without being corrupted.

FIG. 6A is a timing diagram illustrating the effects of supply voltage failure during the deep retention state and in the absence of supply recovery means. In contrast to the droop/noise scenario depicted in FIG. 5A, the supply voltage V2 experiences a complete failure (dropping to 0V) at time T1. V2 remains at 0V before reverting back to its nominal voltage at time T2. Assuming power switching logic 202 is implemented without the SR unit 300, the failure of V2 at T1 can similarly cause the contents of the SRAM array 204 to become corrupted as a result of VIRTUAL_V1 failing in dependence on V2.

FIG. 6B is a timing diagram illustrating supply voltage recovery as a result of generating VIRTUAL_V1 using an SR unit configured according to techniques disclosed herein, e.g., SR unit 300. In FIG. 6B, V2 undergoes the same changes as in FIG. 6A, experiencing a complete failure at time T1 that lasts until time T2. As shown in FIG. 6B, when V2 drops to 0V, VIRTUAL_V1 is pulled up to V1, i.e., the supply voltage used during the active state. SR unit 300 maintains VIRTUAL_V1 at V1 as long as V2 remains at 0V. In this manner, VIRTUAL_V1 can be kept at a sufficiently high voltage (e.g., 0.75V) throughout the entire duration of T1 to T2. In this case, VIRTUAL_V1 is kept even higher than the voltage (e.g., 0.6V) that would normally be used during deep retention. As discussed above in connection with FIG. 4, when V2 decreases, this creates negative feedback so that transistor MP5 becomes increasingly conducting in correspondence with the decrease in V2. The data stored in SRAM array 204 may therefore be retained without being corrupted. In a complete failure scenario where V2 drops all the way to 0V, transistor MP5 becomes maximally conducting such that the voltage at the drain terminal of MP5 is substantially equal to V1. Based on the discussion in connection with FIGS. 5B and 6B, it will therefore be understood that the SR unit 300 can adapt to a range of abnormal supply voltage conditions ranging from minor droop or noise to complete supply voltage failure.

The operation of the SR unit 300 has been described with respect to the deep-retention state. However, the SR unit 300 can also protect against data corruption in other states as well as during transitions between states. For example, when transitioning from the active state to the deep retention state, SR unit 300 ensures that VIRTUAL_V1 does not become floating when MP0 is switched off and MP1 and MP2 are switched on. This may be performed through appropriate timing of the various control signals in the power switching logic 202. For example, during a transition from the active state to the deep retention state, the control signals C, D, and E of the SR unit 300 may be updated with a delay relative to the updating of the control signals A, BT, and BB so that transistor MP5 continues to drive VIRTUAL_V1 while MP0, MP1, and MP2 are switched to their deep retention configuration. Alternatively or additionally, the transistors of the power switching logic 202 may be sized so that MP3, MP4, MP5, and MN0 have a slower response time than MP0, MP1, and MP2, thereby making the SR unit 300 slower to transition between states compared to the rest of the power switching logic 202. Accordingly, even if there is a delay between when V1 is no longer supplied through path 312 and when V2 becomes available through path 314, the transistor MP5 in SR unit 300 will continue to drive VIRTUAL_V1 (since the gate of MP5 is logic low during the active state) until V2 is available through path 312. Similarly, when transitioning from the deep retention state to the active state, transistor MP5 will drive VIRTUAL_V1 because MP5 provides a weak-current path to V1 during deep retention, as discussed above. Accordingly, SR unit 300 can operate to prevent VIRTUAL_V1 from drooping during state transitions.

FIG. 7A is a timing diagram illustrating an example supply voltage sequence. In FIG. 7A, the supply voltage V2 is ramped-up earlier than the supply voltage V1, so that V2 settles (e.g., at 0.6V) before V1 settles (e.g., at 0.75V). The ramp-up of V1 and V2 may occur at various times during system operation, such as when the system boots up. In FIG. 7A, the ramp-up order of the supply voltages is the opposite of the ramp-down order. However, this need not always be the case. In some instances, the ramp-up order and the ramp-down order may be reversed. During the ramp-down operation in FIG. 7A, V1 is ramped down earlier so that V1 settles (e.g., at 0V) before V2 settles (e.g., at 0V). Ramp-down may occur at various times during system operation including, but not limited to, during system shut-down. For instance, there may be times in which the components (e.g., SRAM array 204) that are connected to the supply rails for V1 and V2 are not actively being used, in which case V1 and V2 can be ramped down to conserve power while other components in the system continue to operate. As one example, the imaging device 150 or a camera of the eye-tracking unit 130 in FIG. 1 may be configured to capture images at a certain frame rate, and the SRAM array 204 may be used to store image frames. While imaging device 150 or eye-tracking unit 130 is capturing an image, the SRAM array 204 and other components that will process the captured image can be placed into a low-power configuration until the image data is ready to be written to SRAM array 204 or otherwise processed. Accordingly, to conserve power, V1 and V2 may be ramped down on a per-frame basis and then ramped up once the frame of image data becomes available.

Other supply sequencing options besides the supply sequence shown in FIG. 7A are also possible. However, depending on the design of the SRAM unit, in particular the design of the power switching logic that switches between V1 and V2, some supply sequences may not be supported or may incur a significant penalty in terms of power consumption or memory reliability. An example of a supply sequence that can increase power consumption or produce reliability issues in some SRAM designs is shown in FIG. 7B.

Figure 8:
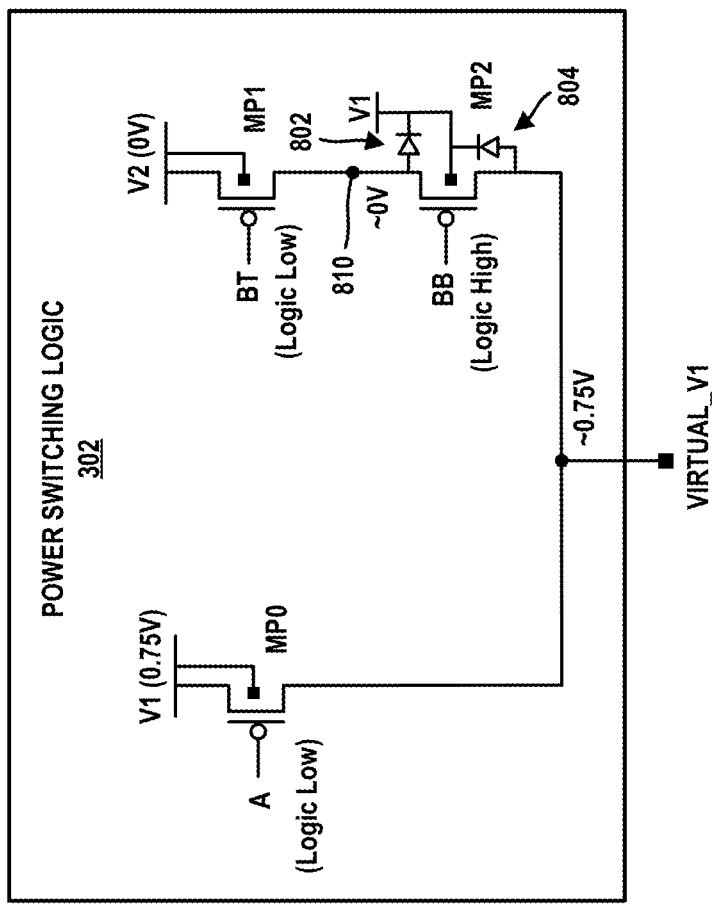
FIG. 8 shows an example state of the power switching logic in FIG. 3A during ramp-up and ramp-down portions of the timing diagram in FIG. 7B.

FIG. 7B is a timing diagram illustrating an example supply voltage sequence. In FIG. 7B, the ramp-up and ramp-down timing of V1 and V2 is the opposite of that shown in FIG. 7A. Specifically, V1 is ramped-up earlier to settle before V2 settles, and V2 is ramped-down earlier to settle before V1 settles. The time period between when V1 starts to ramp up and V2 starts to ramp up (labeled 710) and the time period between when V2 finishes ramping down and V1 finishes ramping down (labeled 720) can be problematic for some SRAM designs because the time periods 710 and 720 may be times during which the power switching logic is operating sub-optimally. For instance, body diodes in the transistors that operate to switch between V1 and V2 may be forward-biased whenever V2 is 0V and V1 is greater than 0V, as is the case during time periods 710 and 720. As shown in FIG. 8, the power switching logic 202 implementation in FIG. 3A avoids this forward-biasing problem.

FIG. 8 shows an example state of the power switching logic 202 during the ramp-up and ramp-down portions of the timing diagram in FIG. 7B, e.g., during the time period 710 or the time period 720. The SR unit 300 is omitted from FIG. 8 for simplicity. FIG. 8 depicts a scenario in which the supply voltage V1 is 0.75V and the supply voltage V2 is 0V. FIG. 8 may, for example, represent a time during the ramp-up phase (time period 710) when V1 has settled to 0.75V but V2 has not yet begun to ramp up. Alternatively, FIG. 8 may represent a time during the ramp-down phase (time period 720) when V2 has settled to 0V but V1 has not yet begun to ramp down. The scenario depicted in FIG. 8 may be generalized to any situation in which V1 is higher than V2 by at least a turn-on threshold (forward voltage) of the body diodes. Accordingly, it will be understood that the functionality of the power switching logic 202 as described in connection with FIG. 8 also applies to other ramping scenarios.

FIG. 8 depicts body diodes 802 and 804 associated with the transistor MP2. Body diode 802 is a parasitic diode formed between the source of MP2 and the n-well of MP2. Body diode 804 is a parasitic diode formed between the drain of MP2 and the n-well of MP2. Additional body diodes are formed at the transistors MP0 and MP1. For simplicity, the description of FIG. 8 is limited to the body diodes associated with MP2, and these additional body diodes are omitted from the figure.

FIG. 8 is provided in order to illustrate that there exists at least one combination of gate inputs (the control signals A, BT, and BB) for which no body diodes in the power switching logic 202 are forward-biased. In the example shown, control signal A and control signal BT are set to 0 (logic low), while control signal BB is set to 1 (logic high).

In this configuration, transistors MP0 and MP1 are on, and transistor MP2 is off. With MP0 being on and MP2 being off, the voltage of VIRTUAL_V1 is approximately equal to V1 (e.g., slightly less than 0.75V). Because the n-well of transistor MP2 is tied to V1, the voltage at the anode side of body diode 804 is insufficient relative to the voltage at the cathode side of body diode 804 to cause the body diode to turn on. That is, VIRTUAL_V1 minus V1 will be below the forward voltage of body diode 804 so that body diode 804 cannot be forward-biased but is instead reverse-biased.

Similarly, the body diode 802 is also reverse-biased in the scenario depicted in FIG. 8. With MP1 being on and MP2 being off, the voltage at the source of MP2 (node 810 in the figure) is approximately equal to V2, e.g., close to 0V. The voltage difference across the body diode 802, which is approximately equal to 0V minus 0.75V, will be below the forward voltage of body diode 802 so that body diode 802 cannot be forward-biased.

Accordingly, the power switching logic 202 can be configured to prevent forward-biasing during the ramp-up and ramp-down phases regardless of the order in which V1 and V2 are ramped up or down. Forward-biasing is prevented so long as the gate inputs of transistors MP0, MP1, and MP2 (i.e., control signals A, BT, and BB) are set to appropriate values. For example, control signals A, BT, and BB may be set to 0, 0, and 1, respectively, throughout the durations of the time periods 710 and 720 when using the supply sequencing option in FIG. 7B. Further, it will be appreciated that setting the gate inputs in the manner shown in FIG. 8 is possible because the transistors can be controlled separately. For instance, the gates of MP0 and MP2 can be set to opposite values (e.g., logic low and logic high, as shown). Similarly, the gates of MP1 and MP2, which are usually set to the same logic value, can be set to opposite values as needed, e.g., during the power-down state, as shown in table 750. In contrast, prevention of forward-biasing may not be possible in other power-switching logic designs. For example, in some designs, no combination of inputs to the power-gating devices would avoid forward-biasing during the ramp-up and ramp-down phases shown in FIG. 7B. As another example, some designs may not support the ability to set an appropriate combination of inputs because at least some of the inputs to the power-gating devices are tied to the same control signal.

Figure 9A:
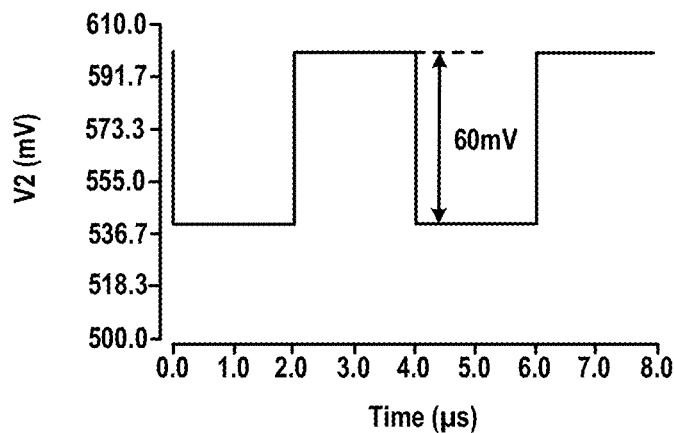
FIG. 9A is a timing diagram showing an example of static supply voltage droop.

FIG. 9A is a timing diagram showing an example of static supply voltage droop. In FIG. 9A, the supply voltage V2 has a nominal voltage of 0.6V (600 millivolts or mV) and experiences a 60 mV droop. The droop in FIG. 9A is static because the 60 mV decrease is sustained, with V2 remaining at the same lowered voltage (approximately 540 mV) over a period of approximately two microseconds (μs). In other words, FIG. 9A represents a scenario where the voltage level of V2 fluctuates at a relatively low frequency compared to, for example, the dynamic droop scenario shown in FIG. 10A.

Figure 9B:
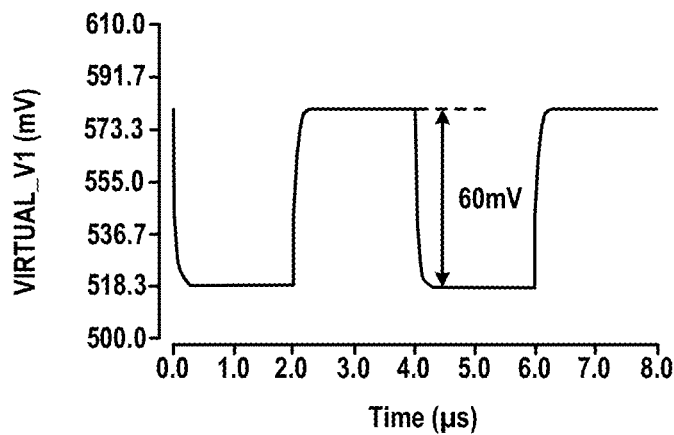
FIG. 9B is a timing diagram showing the effects of static supply voltage droop in the absence of droop rejection.

FIG. 9B is a timing diagram showing the effect of the static supply voltage droop in FIG. 9A on VIRTUAL_V1 in the absence of droop rejection. As shown in FIG. 9B, the resulting droop in VIRTUAL_V1 matches the 60 mV droop in V2.

Figure 9C:
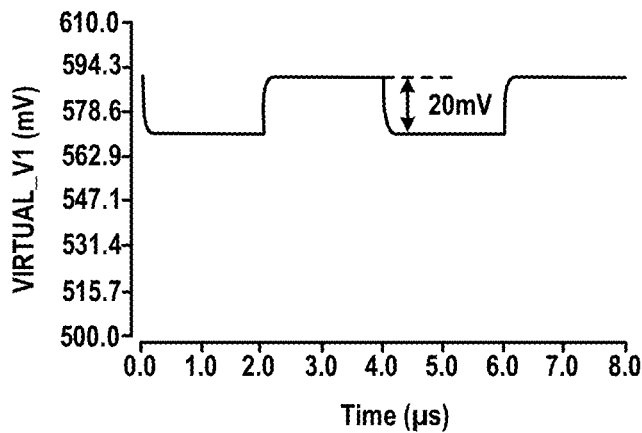
FIG. 9C is a timing diagram showing rejection of static supply voltage droop, based on techniques disclosed herein.

FIG. 9C is a timing diagram showing rejection of the static supply voltage droop in FIG. 9A based on techniques disclosed herein. As shown in FIG. 9C, the amount of droop observed on VIRTUAL_V1 is 20 mV. Although the droop in VIRTUAL_V1 attributed to V2 is not eliminated completely, the VIRTUAL_V1 droop is significantly smaller compared to the droop that VIRTUAL_V1 would otherwise experience, for example, a three-fold attenuation relative to the 60 mV droop shown in FIG. 9B. This reduction in the amount of droop in VIRTUAL_V1 may be realized through applying the techniques disclosed herein. For example, FIG. 9C may represent the result of generating VIRTUAL_V1 using SR unit 300 as described above in conjunction with FIG. 4, where negative feedback is used to at least partially offset the V2 droop.

Figure 10A:
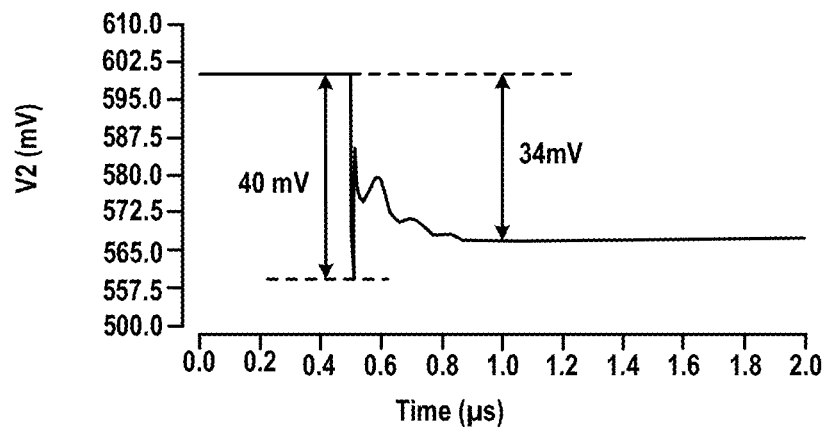
FIG. 10A is a timing diagram showing an example of dynamic droop in combination with static droop.

FIG. 10A is a timing diagram showing an example of dynamic droop in combination with static droop. In FIG. 10A, the supply voltage V2 experiences a sudden decrease of 40 mV at around 0.5 μs. After the 40 mV decrease, V2 swings up and down before settling at approximately 540 mV, around 1 μs. The initial 40 mV decrease corresponds to fast dynamic droop, whereas the transition to 540 mV is analogous to the static droop scenario shown in FIG. 9A. Both the initial 40 mV decrease and the final 540 mV level are below the nominal voltage of 0.6V for V2.

Figure 10B:
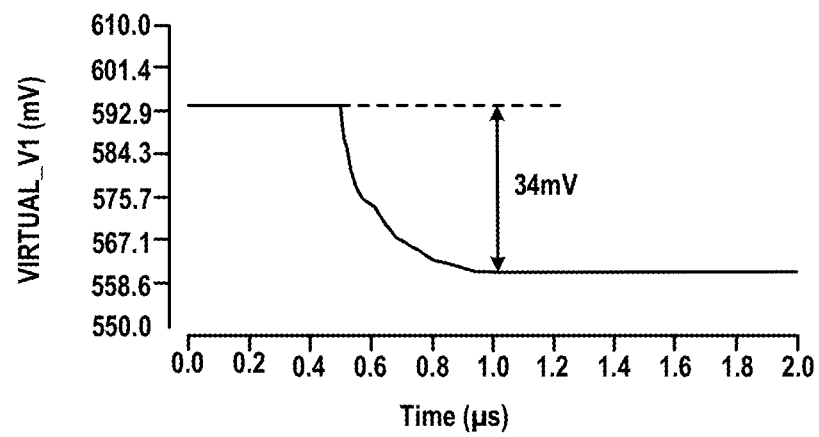
FIG. 10B is a timing diagram showing rejection of dynamic droop without rejection of static droop.

FIG. 10B is a timing diagram showing rejection of the dynamic droop in FIG. 10A but without rejection of the static droop. In FIG. 10B, the sudden 40 mV decrease from FIG. 10A has been filtered out so as to not be observed on VIRTUAL_V1. However, VIRTUAL_V1 is still affected by the static supply voltage droop in V2. As shown in FIG. 10B, VIRTUAL_V1 also transitions from the nominal 0.6V level to the 540 mV level, drooping by 34 mV in dependence on V2. The transition to 540 mV in VIRTUAL_V1 occurs at approximately the same speed as the transition by supply voltage V2 in FIG. 10A but is smoother, with fewer voltage swings. FIG. 10B may represent the result of generating VIRTUAL_V1 using power switching logic that is configured to attenuate fast dynamic droop but is unable to handle static droop.

Figure 10C:
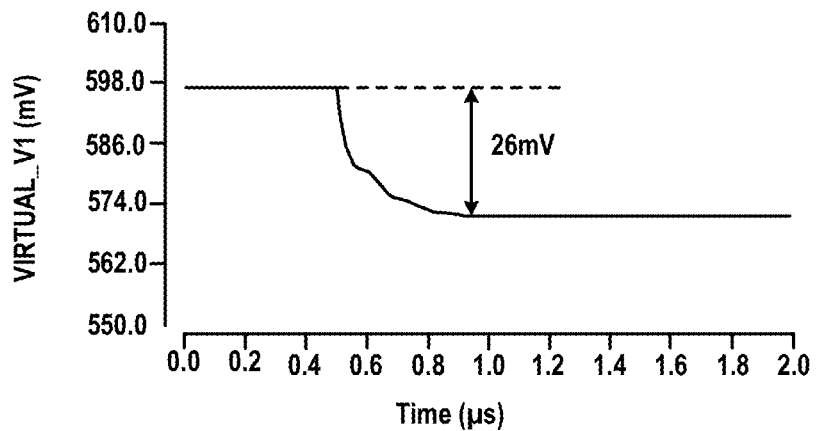
FIG. 10C is a timing diagram showing rejection of both dynamic droop and static droop, based on techniques disclosed herein.

FIG. 10C is a timing diagram showing rejection of both the dynamic droop and the static droop in FIG. 9A, based on techniques disclosed herein. Comparing FIGS. 10B and 10C, it can be seen that the sudden 40 mV decrease in V2 has been filtered out with respect to VIRTUAL_V1. Additionally, the comparatively slower (low frequency) static droop has also been filtered such that VIRTUAL_V1 droops by 26 mV instead of 34 mV. The filtering out of the dynamic droop and the reduction in the amount of static droop in VIRTUAL_V1 may be realized through applying the techniques disclosed herein. For example, FIG. 10C may represent the result of generating VIRTUAL_V1 using SR unit 300 as described above in conjunction with FIG. 4, where negative feedback is used to at least partially offset the V2 droop.

Figure 11:
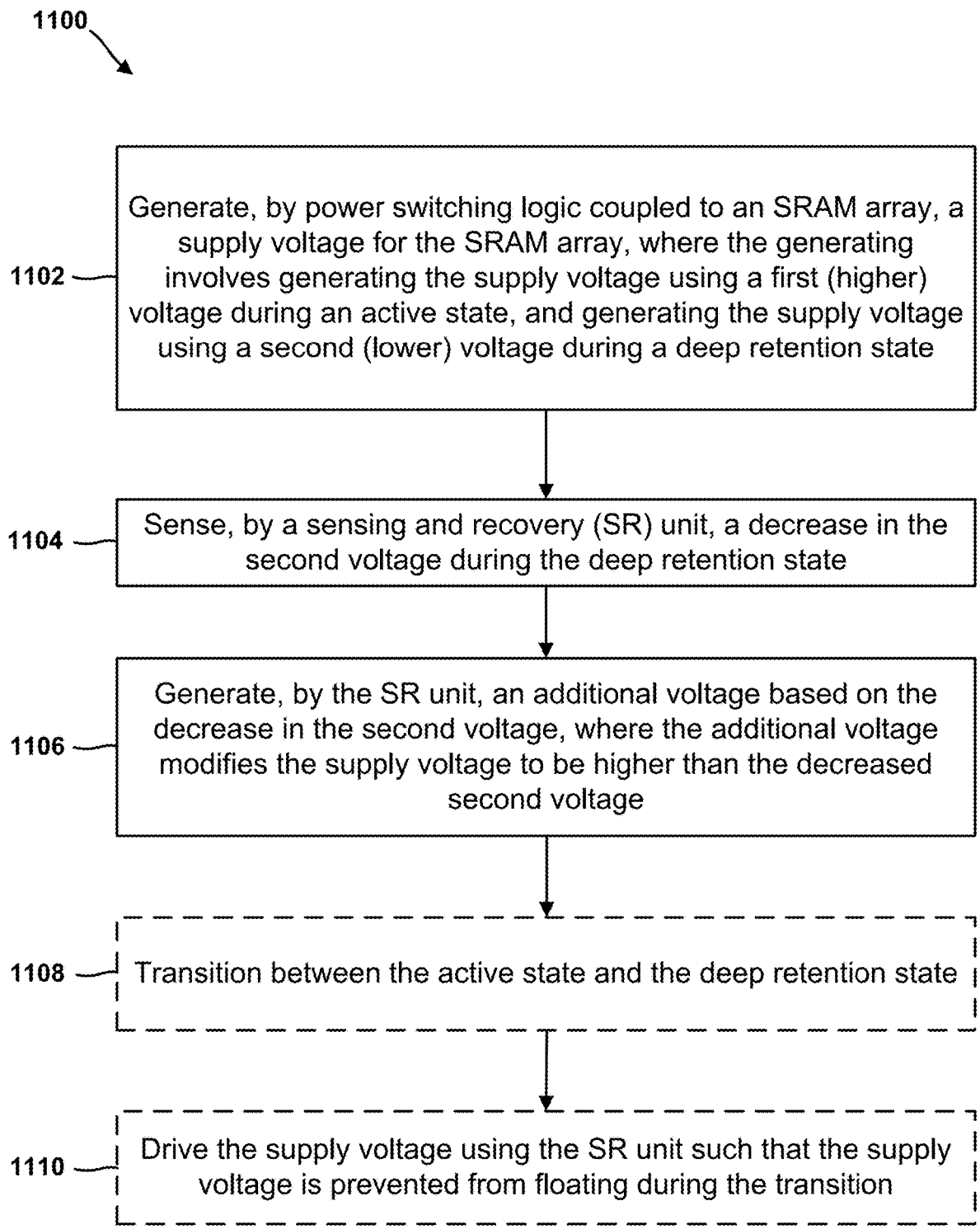
FIG. 11 is a flow diagram of a process for reducing the effects of noise and other supply voltage fluctuations, according to certain embodiments.

FIG. 11 is a flow diagram of a process 1100 for reducing the effects of noise and other supply voltage fluctuations, according to certain embodiments. Process 1100 can be performed using power switching logic and an SR unit (e.g., SR unit 300). As indicated in the example of FIG. 3A, the SR unit may, in some embodiments, be integrated into the power switching logic. The functionality described with respect to the process 1100 may be implemented using control signals that are generated locally within the power switching logic and/or the SR unit. In some implementations, one or more control signals may be supplied from a separate controller such as the SRAM controller 212 in FIG. 2 or by a controller outside the SRAM unit 200.

At block 1102, the power switching logic generates a supply voltage for an SRAM array (e.g., SRAM array 204). The power switching logic is configured to input the supply voltage to the SRAM array as a voltage signal (e.g., VIRTUAL_V1) that is communicated through a connection between the power switching logic and the SRAM array, for example, a wire trace or interconnect leading to node 310. As discussed above, an SRAM array may, along with other components of an SRAM unit such as periphery logic 206, be operated according to various predefined states. Accordingly, the functionality in block 1102 may involve generating the supply voltage using a first, higher voltage during an active state, and generating the supply voltage using a second, lower voltage during a deep retention state. The first voltage (e.g., V1) and the second voltage (e.g., V2) can be supplied to the power switching logic through respective supply rails. The power switching logic may be configured to place the SRAM array into the deep retention state during times when the SRAM array is not being accessed. When the SRAM array is to be written to or read from, the power switching logic can revert back to the active state.

At block 1104, the SR unit senses a decrease in the second voltage during the deep retention state. Referring back to FIGS. 3B and 3C, the SR unit may be configured to monitor the second voltage, at least during the deep retention state. In the circuit implementation of FIG. 3B, SR unit 300 is configured by setting the gate inputs of transistors MP3, MP4, and MN0 according to the state. In particular, MP3 is turned on during the deep retention state such that MP3 is configured to pass V2 as a control signal to the gate of transistor MP5. In this manner, any changes in V2 during the deep retention state are observed at the gate of MP5. In block 1104, the decrease in the second voltage may correspond to noise or droop (e.g., due to crosstalk from other components coupled to the second voltage). Alternatively, the decrease may be a complete or near complete failure of the second voltage, such as the scenario depicted in FIG. 6A.

At block 1106, the SR unit generates an additional voltage based on the decrease in the second voltage. This additional voltage modifies the supply voltage generated by the power switching logic such that the supply voltage becomes higher than the decreased second voltage (e.g., the scenario in FIG. 5B or the scenario in FIG. 6B). The SR unit can modify the supply voltage because, as shown in FIG. 3A, the SR unit may also be coupled to the node 310 where the supply voltage is output by the power switching logic. In some instances, the additional voltage generated by the SR unit may substantially cancel out or eliminate the effects of the decrease in the second voltage so that the supply voltage is approximately equal to the nominal voltage level of the second voltage (e.g., 0.6V). In other instances, the additional voltage may only partially offset the effects of the decrease in the second voltage. Further, as described above in conjunction with FIG. 6B, the SR unit may, in some instances, pull the supply voltage above the nominal voltage level of the second voltage (e.g., to 0.75V or the nominal voltage level of the first voltage). In any event, the additional voltage generated by the SR unit may keep the supply voltage sufficiently high (above a data retention voltage) to prevent loss or corruption of any data currently stored in the SRAM array.

At block 1108, the power switching logic may optionally transition the SRAM array between the active state and the deep retention state. For example, the transition in block 1108 may occur in connection with transitioning from the deep retention state of block 1106 to the active state as part of waking up the SRAM array in preparation for a read or write. Alternatively, the transition in block 1108 may involve transitioning back to the deep retention state after going into the active state sometime between block 1106 and block 1108.

At block 1110, the SR unit drives the supply voltage generated by the power switching logic, such that the supply voltage is prevented from floating during the transition in block 1108. For example, as discussed above, the transistor MP5 of SR unit 300 may be configured to provide a weak-current path to V1 during the deep retention state or to provide a full-current path to V1 (when the gate of MP5 is set to logic low) during the active state.

Figure 12:
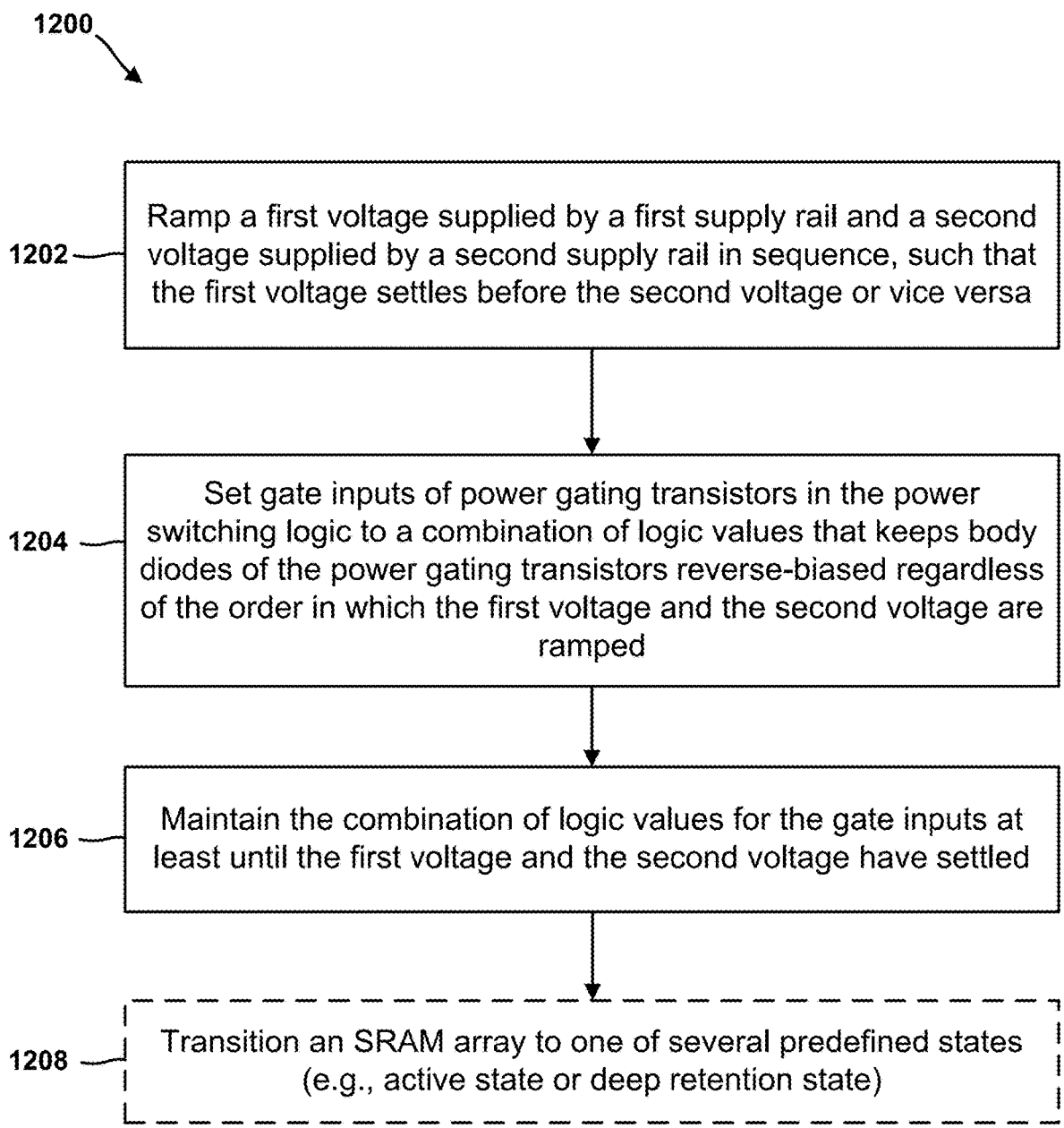
FIG. 12 is a flow diagram of a process for preventing forward-biasing during ramping of supply voltages, according to certain embodiments.

FIG. 12 is a flow diagram of a process 1200 for preventing forward-biasing during ramping of supply voltages, according to certain embodiments. Process 1200 can be performed using power switching logic that supports flexible supply sequencing, e.g., power switching logic 202 as shown in the example of FIG. 3A. The functionality described with respect to the process 1200 may be implemented using control signals that are generated locally within the power switching logic. In some implementations, one or more control signals may be supplied from a separate controller such as the SRAM controller 212 in FIG. 2 or by a controller outside the SRAM unit 200.

At block 1202, a first voltage supplied by a first supply rail and a second voltage supplied by a second supply rail are ramped (up or down) in sequence such that the first voltage settles before the second voltage or vice versa. The functionality in block 1202 can be performed during a time when an SRAM array is not storing any useful data (e.g., data that will subsequently be retrieved and processed) so that data retention is unnecessary. For example, block 1202 may correspond to a ramping operation performed during a system boot and prior to performing the process 1100 in FIG. 11. Alternatively, the ramping operation may be performed after system boot, e.g., during runtime execution of a software application. For instance, the functionality in block 1202 may occur after data that was retained with the aid of the supply voltage generated in block 1106 of FIG. 11 has been read out of the SRAM array for processing and before a new set of data is written to the SRAM array. Ramp-up or ramp-down may also be performed in other situations depending on whether there is a need for the first voltage and the second voltage at any particular time by components that are coupled to the supply rails.

The first voltage and the second voltage in the process 1200 may correspond to the voltages described with respect to the process 1100. That is, the first voltage (e.g., V1) may be a higher voltage supplied by a first supply rail, and the second voltage (e.g., V2) may be a lower voltage supplied by a second supply rail. Each supply rail may have a nominal voltage associated with it, corresponding to the voltage level that the supply rail is expected to provide during system operation. For instance, the first voltage may have a nominal voltage of 0.75V, and the second voltage may have a nominal voltage of 0.6V.

Typically, ramp-up involves bringing the voltage of a supply rail up to its nominal voltage in one continuous operation. However, some implementations may support multi-stage ramp-up, in which the voltage of a supply rail is first brought up to an intermediate voltage level (e.g., to settle at the intermediate voltage for a period of time) before ramping again to bring the voltage up to the nominal voltage. Ramp-down usually involves bringing the voltage of a supply rail down to 0V or, more generally, to a voltage below the nominal voltage. In some implementations, the voltage of a supply rail may be ramped down to an intermediate voltage, as part of a multi-stage ramp-down.

The ramping in block 1202 may be performed under the supervision of a controller associated with a power delivery network. For example, the controller may include a processor or integrated circuit that is part of, or coupled to, one or more voltage regulators that generate the first voltage and the second voltage as direct current (DC) voltages. The controller and the voltage regulator(s) may be co-located on the same device as the power switching logic, e.g., to form a power supply unit of an HMD or console. The controller may determine when to begin ramping the first voltage and the second voltage. In some embodiments, the controller may also determine a ramping function (e.g., the slope of the waveform) for the first voltage and/or the second voltage. The ramping function may be fixed or configurable (e.g. programmable).

At 1204, power gating transistors in the power switching logic are controlled to keep body diodes of the power gating transistors reversed-biased. In particular, gate inputs of the power gating transistors are set to a combination of logic values that keeps the body diodes reverse-biased regardless of the order in which the first voltage and the second voltage are ramped during the ramping operation in block 1202. An example of such a combination of logic values is described above in conjunction with FIG. 8.

At 1206, the combination of logic values is maintained at least until the first voltage and the second voltage have settled. For example, referring back to FIG. 7B, the combination of logic values that was set in block 1204 may be applied to the gates of the power gating transistors throughout the entire duration of the ramp-up phase corresponding to time period 710 and/or throughout the entire duration of the ramp-down phase corresponding to time period 720. The intervening period between time period 710 and time period 710 may, in some instances, correspond to a time in which one or more components coupled to the supply rails are active. For example, SRAM array 204 may be in the active state during some or all of this intervening period. Accordingly, the gates of the power gating transistors in the power switching logic may be set to a different combination of logic values during the intervening period. For example, during the intervening period, the control signals A, BT, and BB may be set to the logic values associated with the active state, the deep retention state, and/or some other state, as shown in table 850 of FIG. 3C.

At 1208, an SRAM array (e.g., SRAM array 204) may optionally be transitioned to one of several predefined states, e.g., the active state or the deep retention state and during the intervening period described above. During the transition to the predefined state and, more generally, anytime outside of a ramping operation, the risk of forward-biasing may be minimized due to the configuration of the power switching logic. For example, the arrangement of transistors MP0, MP1, and MP2 shown in FIG. 3A is configured to maintain reverse-biasing of the body diodes as long as V1 remains higher than V2, e.g., when V1 and V2 stay within a certain range of their respective nominal voltages. During the active state, MP2 can be controlled to isolate MP1 from VIRTUAL_V1, which is set to approximately V1, thereby preventing forward biasing of the body diode between the drain and the bulk of MP1. During the deep retention state, VIRTUAL_V1 is set to approximately V2, so the body diodes 802 and 804 in FIG. 8 are reverse-biased due to the bulk of transistor MP2 being tied to V1. Similarly, the bulk of transistor MP0 is also tied to V1 so that, during the deep retention state, the voltage difference across the body diode located between the drain and the bulk of MP0 is essentially the same as the voltage difference across body diode 804. Other body diodes of the transistors MP0, MP1, and MP2 are also reverse-biased during the active state and the deep retention state.

The embodiments described herein may be used in conjunction with various technologies. For example, embodiments may be used in an artificial reality system environment, as discussed above. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 13:
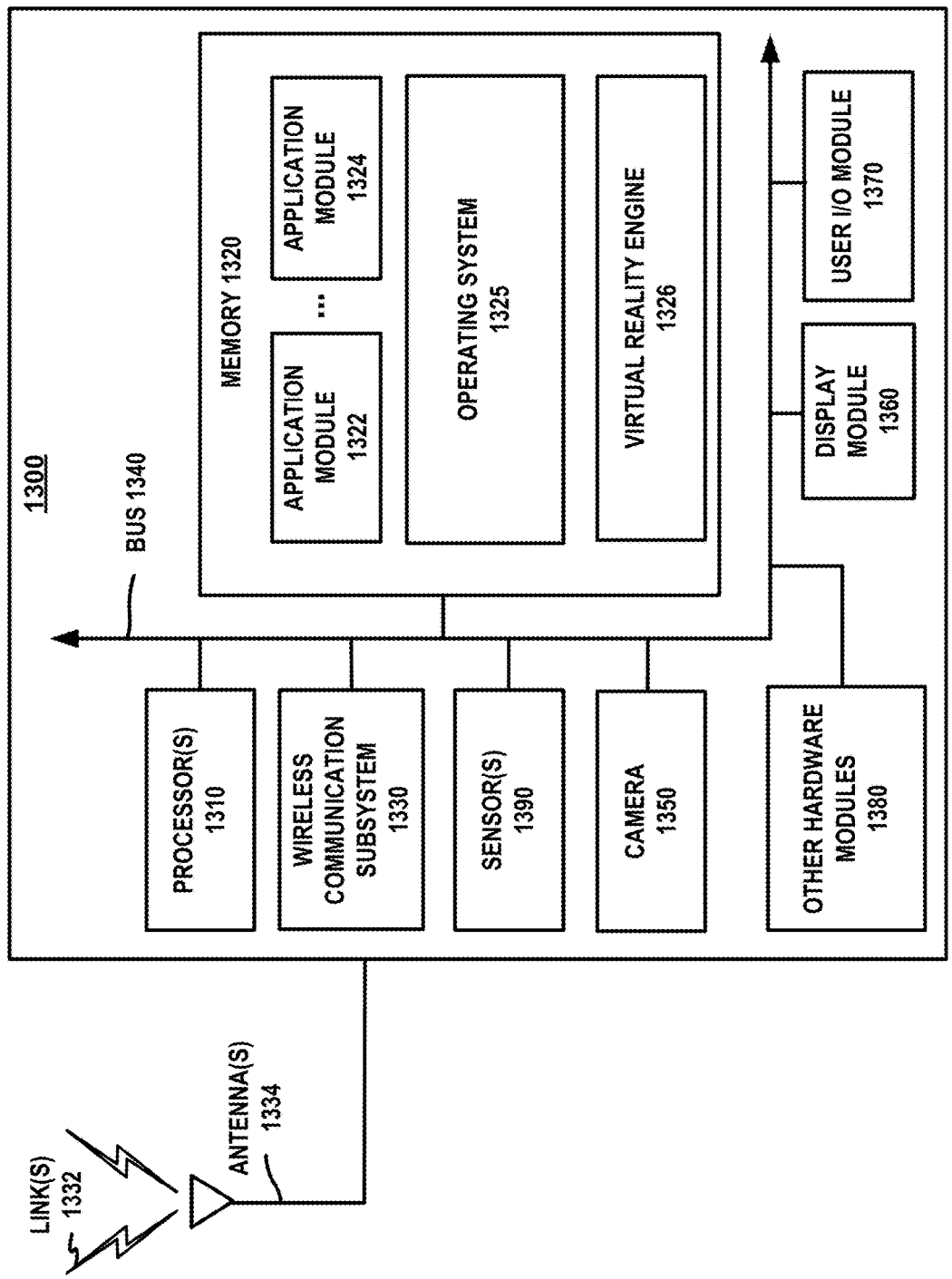
FIG. 13 is a block diagram of an example electronic system usable for implementing one or more of the embodiments disclosed herein.

FIG. 13 is a block diagram of an example electronic system 1300 usable for implementing one or more of the embodiments disclosed herein. For example, electronic system 1300 may correspond to a near-eye display (e.g., HMD) and/or a console in an artificial reality system environment such as that depicted in FIG. 1. Electronic system 1300 may include one or more processor(s) 1310 and a memory 1320. Processor(s) 1310 may be configured to execute instructions for performing operations at a number of components, and can be, for example, a general-purpose processor or microprocessor suitable for implementation within a portable electronic device. In some embodiments, at least some of the processor(s) 1310 are embedded on a SoC integrated circuit. Processor(s) 1310 may be communicatively coupled with a plurality of components within electronic system 1300. To realize this communicative coupling, processor(s) 1310 may communicate with the other illustrated components across a bus 1340. Bus 1340 may be any subsystem adapted to transfer data within electronic system 1300. Bus 1340 may include a plurality of computer buses and additional circuitry to transfer data.

Memory 1320 may be coupled to processor(s) 1310. In some embodiments, memory 1320 may offer both short-term and long-term storage and may be divided into several units. Memory 1320 may be volatile, such as static random access memory (SRAM) and/or dynamic random access memory (DRAM) and/or non-volatile, such as read-only memory (ROM), flash memory, and the like. Furthermore, memory 1320 may include removable storage devices, such as secure digital (SD) cards. Memory 1320 may provide storage of computer-readable instructions, data structures, software modules, and other data for electronic system 1300. In some embodiments, memory 1320 may be distributed into different hardware modules. A set of instructions and/or code may be stored on memory 1320. The instructions can take the form of executable code, source code, and/or installable code. In some embodiments, memory 1320 includes one or more SRAM arrays configured in accordance with the power-related techniques disclosed herein. For example, memory 1320 may include one or more instances of SRAM unit 200 and one or more instances of power switching logic 202.

In some embodiments, memory 1320 may store a plurality of application modules 1322 to 1324, which may include any number of applications. Examples of applications may include gaming applications, conferencing applications, video playback applications, or other suitable applications. The applications may include a depth sensing function or eye tracking function. Application modules 1322-1324 may include particular instructions to be executed by processor(s) 1310. In some embodiments, certain applications or parts of application modules 1322-1324 may be executable by other hardware modules 1380. In certain embodiments, memory 1320 may additionally include secure memory, which may include additional security controls to prevent copying or other unauthorized access to secure information.

In some embodiments, memory 1320 may include an operating system 1325 loaded therein. Operating system 1325 may be operable to initiate the execution of the instructions provided by application modules 1322-1324 and/or manage other hardware modules 1380 as well as interfaces with a wireless communication subsystem 1330 which may include one or more wireless transceivers. Operating system 1325 may be adapted to perform other operations across the components of electronic system 1300 including threading, resource management, data storage control and other similar functionality.

Wireless communication subsystem 1330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1300 may include one or more antennas 1334 for wireless communication as part of wireless communication subsystem 1330 or as a separate component coupled to any portion of the system. Depending on desired functionality, wireless communication subsystem 1330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other type of network. The techniques described herein may also be used for any combination of WWAN, WLAN, and/or WPAN. Wireless communications subsystem 1330 may permit data to be exchanged with a network, other computer systems, and/or any other devices described herein. Wireless communication subsystem 1330 may include a means for transmitting or receiving data, such as identifiers of HMD devices, position data, a geographic map, a heat map, photos, or videos, using antenna(s) 1334 and wireless link(s) 1332. Wireless communication subsystem 1330, processor(s) 1310, and memory 1320 may together comprise at least a part of one or more of a means for performing some functions disclosed herein.

Electronic system 1300 may include one or more sensors 1390. Sensor(s) 1390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1300 may include a display module 1360. Display module 1360 can be a near-eye display and may graphically present information, such as images, videos, and instructions, from electronic system 1300 to a user. Such information may be derived from one or more application modules 1322-1324, virtual reality engine 1326, one or more other hardware modules 1380, a combination thereof, or any other suitable means for generating graphical content for presentation to the user. Display module 1360 may use LCD technology, LED technology, light emitting polymer display (LPD) technology, or some other display technology.

Electronic system 1300 may include a user input/output module 1370. User input/output module 1370 may allow a user to send action requests to electronic system 1300. An action request may be a request to perform a particular action. For example, an action request may be to start or end an application or to perform a particular action within the application. User input/output module 1370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1300. In some embodiments, user input/output module 1370 may provide haptic feedback to the user in accordance with instructions received from electronic system 1300. For example, the haptic feedback may be provided when an action request is received or has been performed.

Electronic system 1300 may include a camera 1350 that can be used to take photos or videos of a user, for example, for tracking the user's eye position. Camera 1350 may also be used to take photos or videos of the environment, for example, for VR, AR, or MR applications. Camera 1350 may include, for example, a complementary metal-oxidesemiconductor (CMOS) image sensor with a few millions or tens of millions of pixels. In some implementations, camera 1350 may include two or more cameras that may be used to capture three-dimensional images.

In some embodiments, electronic system 1300 may include a plurality of other hardware modules 1380. A hardware module 1380 may be a physical module within electronic system 1300. Some hardware modules 1380 may be temporarily configured to perform specific functions or temporarily activated. Hardware modules 1380 may include, for example, an audio output and/or input module (e.g., a microphone or speaker), a near field communication (NFC) module, a rechargeable battery, a battery management system, a wired/wireless battery charging system, and/or the like. In some embodiments, one or more functions of hardware modules 1380 may be implemented in software.

In some embodiments, memory 1320 may store a virtual reality engine 1326. Virtual reality engine 1326 may execute applications within electronic system 1300 and receive position information, acceleration information, velocity information, predicted future positions, or any combination thereof from various sensors 1390. In some embodiments, the information received by virtual reality engine 1326 may be used for producing a signal (e.g., display instructions) to display module 1360. For example, if the received information indicates that the user has looked to the left, virtual reality engine 1326 may generate content for the display module 1360 that mirrors the user's eye movement in a virtual environment. Additionally, virtual reality engine 1326 may perform an action within an application in response to an action request received from user input/output module 1370 and provide feedback to the user. The provided feedback may be visual, audible, or haptic feedback. In some implementations, processor(s) 1310 may include one or more GPUs that execute virtual reality engine 1326.

In various implementations, the above-described hardware and modules may be implemented on a single device or on multiple devices that can communicate with one another using wired or wireless connections. For example, in some implementations, some components or modules, such as GPUs, virtual reality engine 1326, and applications (e.g., tracking application), may be implemented on a console separate from the near-eye display. In some implementations, one console may be connected to or support more than one near-eye display.

In alternative configurations, different and/or additional components may be included in electronic system 1300. Similarly, functionality of one or more of the components can be distributed among the components in a manner different from the manner described above. For example, in some embodiments, electronic system 1300 may be modified to include other system environments, such as an augmented reality system environment and/or mixed reality system environment.

In the present disclosure, for the purposes of explanation, specific details are set forth in order to provide a thorough understanding of the disclosed examples. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a software module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A system, comprising:
    a static random access memory (SRAM) array comprising a plurality of SRAM bit cells;
    power switching logic configured to generate a supply voltage for the SRAM array, wherein:
        the power switching logic generates the supply voltage using a first supply rail during an active state and using a second supply rail during a deep retention state,
        the first supply rail supplies a first voltage, and
        the second supply rail supplies a second voltage that is lower than the first voltage; and
    a sensing and recovery (SR) unit configured to:
        sense a decrease in the second voltage during the deep retention state; and
        generate an additional voltage based on the decrease in the second voltage, wherein the additional voltage modifies the supply voltage generated by the power switching logic such that the supply voltage, as modified by the additional voltage, is higher than the decreased second voltage.

2. The system of claim 1, wherein the SR unit is configured to:
    receive the first voltage from the first supply rail;
    receive the second voltage from the second supply rail; and
    generate the additional voltage using the first voltage as received by the SR unit.

3. The system of claim 2, wherein the SR unit comprises a first transistor configured to pass the first voltage, and wherein a gate input of the first transistor is derived from the second voltage as received by the SR unit.

4. The system of claim 3, wherein the SR unit further comprises a second transistor configured to generate the gate input of the first transistor by passing the second voltage.

5. The system of claim 3, wherein the SR unit is configured to set the gate input of the first transistor such that the first transistor is at least partially conducting during the active state and during the deep retention state.

6. The system of claim 1, wherein the SR unit is configured to cause the supply voltage to increase toward the first voltage as the second voltage decreases during the deep retention state.

7. The system of claim 1, wherein the SR unit is configured to drive the supply voltage during transitions between the active state and the deep retention state such that the supply voltage is prevented from becoming floating during the transitions.

8. The system of claim 1, wherein the power switching logic comprises:
a first power gating transistor configured to pass the first voltage during the active state;
a second power gating transistor configured to pass the second voltage during the deep retention state; and
a third power gating transistor configured to isolate the second power gating transistor from the first voltage during the active state,
wherein the power switching logic is configured such that body diodes of the first power gating transistor, the second power gating transistor, and the third power gating transistor are reverse-biased regardless of an order in which the first voltage and the second voltage are ramped.

9. The system of claim 8, wherein a bulk terminal of the third power gating transistor is tied to the first voltage.

10. The system of claim 8, wherein gate inputs of the first power gating transistor, the second power gating transistor, and the third power gating transistor are settable to a combination of logic values that keeps the body diodes reverse-biased when the first voltage is higher than the second voltage by at least a turn-on threshold of the body diodes.

11. The system of claim 1, further comprising:
a System on Chip (SoC) integrated circuit that comprises:
the SRAM array;
the power switching logic;
the SR unit; and
one or more processors configured to access the SRAM array during the active state.

12. A method, comprising:
generating, by power switching logic coupled to a static random access memory (SRAM) array, a supply voltage for the SRAM array, wherein the generating of the supply voltage comprises:
generating the supply voltage using a first supply rail during an active state; and
generating the supply voltage using a second supply rail during a deep retention state, wherein the first supply rail supplies a first voltage, and wherein the second supply rail supplies a second voltage that is lower than the first voltage;
sensing, by a sensing and recovery (SR) unit, a decrease in the second voltage during the deep retention state; and
generating, by the SR unit, an additional voltage based on the decrease in the second voltage, wherein the additional voltage modifies the supply voltage generated by the power switching logic such that the supply voltage, as modified by the additional voltage, is higher than the decreased second voltage.

13. The method of claim 12, further comprising:
receiving, by the SR unit, the first voltage from the first supply rail;
receiving, by the SR unit, the second voltage from the second supply rail; and
generating the additional voltage using the first voltage as received by the SR unit.

14. The method of claim 13, wherein the SR unit comprises a first transistor configured to pass the first voltage, the method further comprising:
deriving a gate input of the first transistor from the second voltage as received by the SR unit.

15. The method of claim 14, wherein the SR unit further comprises a second transistor configured to generate the gate input of the first transistor by passing the second voltage.

16. The method of claim 14, further comprising:
setting the gate input of the first transistor such that the first transistor is at least partially conducting during the active state and during the deep retention state.

17. The method of claim 12, further comprising:
causing, by the SR unit, the supply voltage to increase toward the first voltage as the second voltage decreases toward during the deep retention state.

18. The method of claim 12, further comprising:
driving, by the SR unit, the supply voltage during transitions between the active state and the deep retention state such that the supply voltage is prevented from becoming floating during the transitions.

19. The method of claim 12, further comprising:
ramping the first voltage and the second voltage in sequence such that either the first voltage settles before the second voltage, or the second voltage settles before the first voltage; and
controlling power gating transistors of the power switching logic to keep body diodes of the power gating transistors reverse-biased regardless of an order in which the first voltage and the second voltage are ramped, wherein the power gating transistors include:
a first power gating transistor configured to pass the first voltage during the active state;
a second power gating transistor configured to pass the second voltage during the deep retention state; and
a third power gating transistor configured to isolate the second power gating transistor from the first voltage during the active state.

20. The method of claim 19, wherein the controlling of the power gating transistors comprises setting gate inputs of the first power gating transistor, the second power gating transistor, and the third power gating transistor to a combination of logic values that keeps the body diodes reverse-biased when the first voltage is higher than the second voltage by at least a turn-on threshold of the body diodes.

* * * * *